(12) United States Patent
Ryusenji et al.

(10) Patent No.: US 7,800,157 B2
(45) Date of Patent: Sep. 21, 2010

(54) METHOD FOR MANUFACTURING SEMICONDUCTOR DEVICE AND SEMICONDUCTOR DEVICE

(75) Inventors: Akihiro Ryusenji, Mie-gun (JP); Minori Kajimoto, Yokkaichi (JP); Yugo Ide, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/174,090

(22) Filed: Jul. 16, 2008

(65) Prior Publication Data

US 2009/0026527 A1 Jan. 29, 2009

(30) Foreign Application Priority Data

Jul. 17, 2007 (JP) ............................. P2007-185627

(51) Int. Cl.
*H01L 29/94* (2006.01)
(52) U.S. Cl. .................. 257/315; 257/314; 257/390; 257/413; 257/E27.084; 257/E27.098; 257/E21.209; 257/E21.646; 438/41
(58) Field of Classification Search .................. 438/41, 438/222; 257/314, 315, 390, E27.084, E27.098, 257/413, E21.209, E21.646, E29.134, E29.135
See application file for complete search history.

(56) References Cited

U.S. PATENT DOCUMENTS

2007/0063256 A1 * 3/2007 Imai et al. ................... 257/315
2008/0246075 A1 10/2008 Matsuno

FOREIGN PATENT DOCUMENTS

JP 2002-231835 8/2002

* cited by examiner

*Primary Examiner*—N Drew Richards
*Assistant Examiner*—Yu-Hsi Sun
(74) *Attorney, Agent, or Firm*—Oblon, Spivak, McClelland, Maier & Neustadt, L.L.P.

(57) ABSTRACT

According to an aspect of the present invention, there is provided a method for manufacturing a semiconductor device including: sequentially forming a first insulating film, a first electrode film, a second insulating film, and a second electrode film on a substrate; forming a groove that separates the second electrode film, the second insulating film and the first electrode film; forming an insulating film inside the groove so that an upper surface thereof is positioned between upper surfaces of the second electrode film and the second insulating film; forming an overhung portion on the second electrode film so as to overhang on the insulating film by performing a selective growth process; and forming a low resistance layer at the overhung portion and the second electrode film by performing an alloying process.

6 Claims, 22 Drawing Sheets

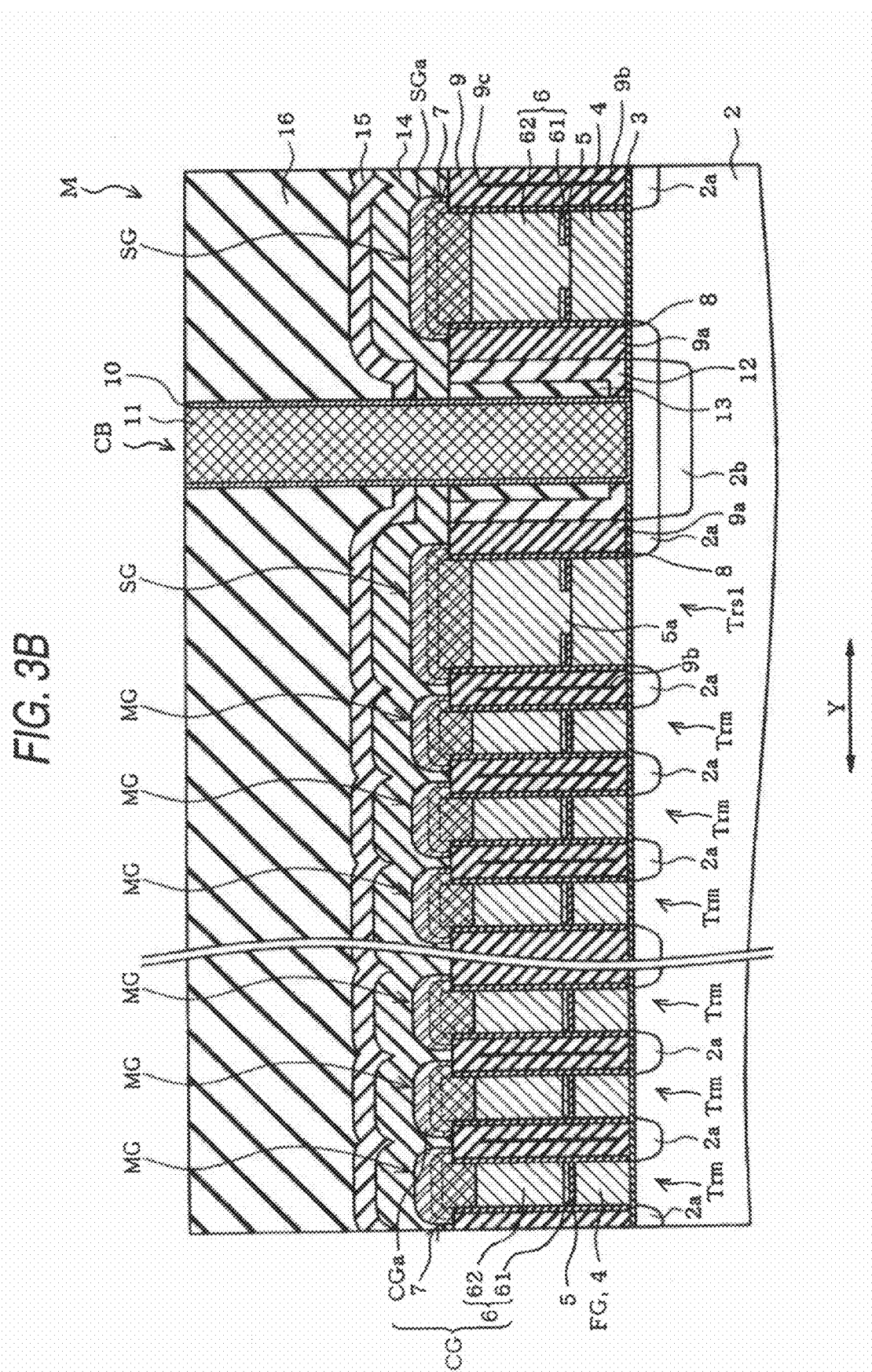

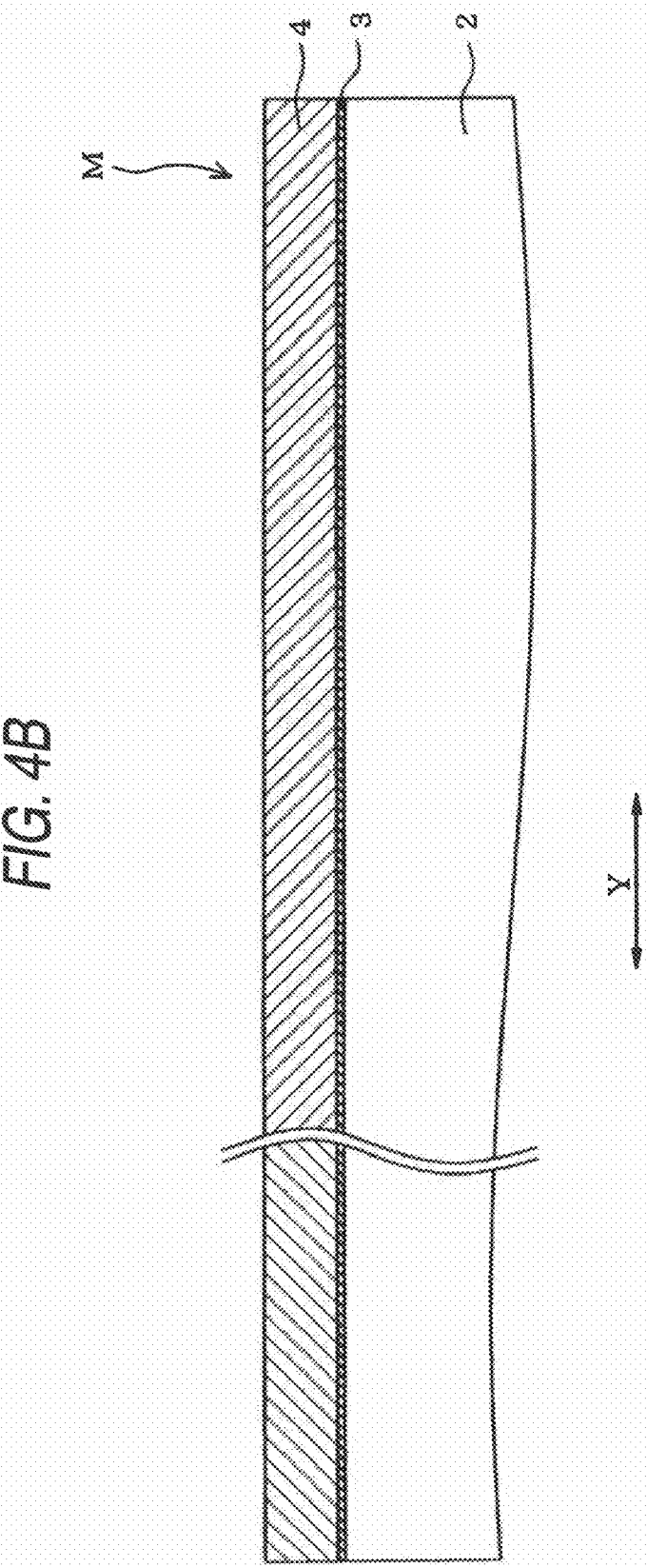

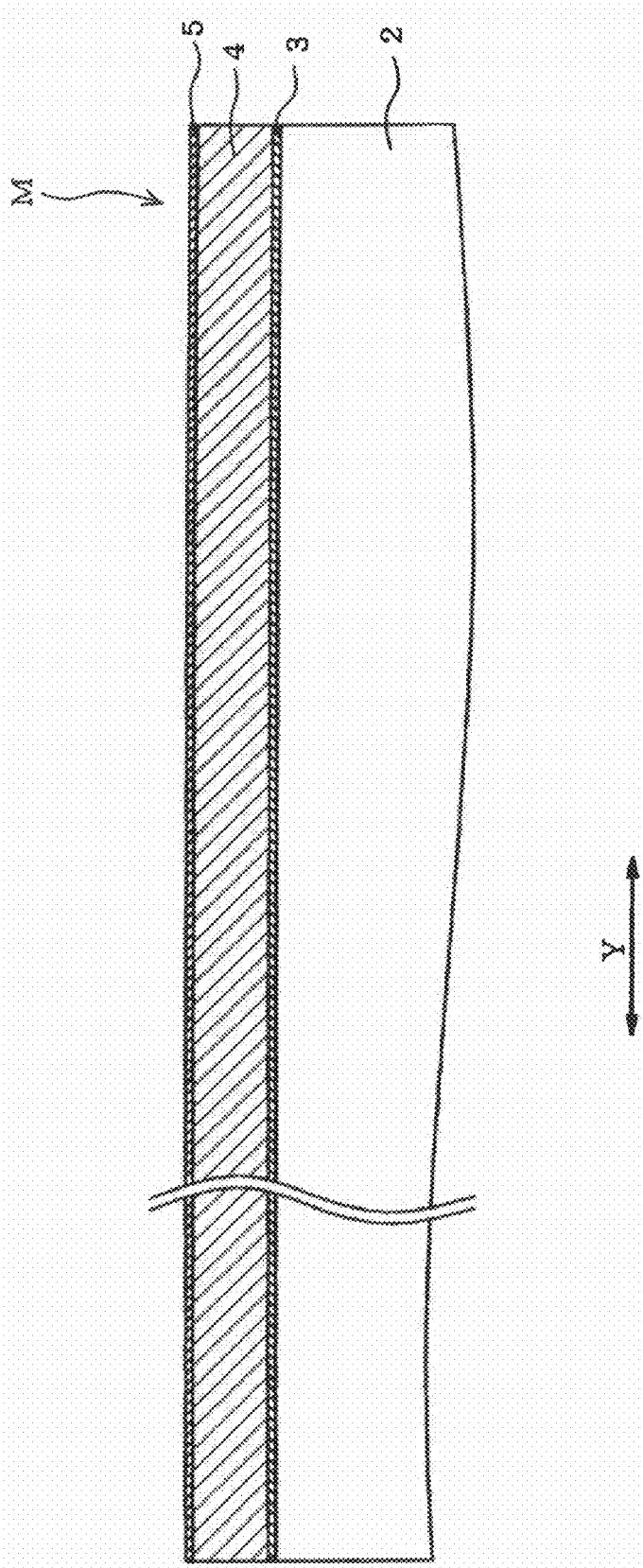

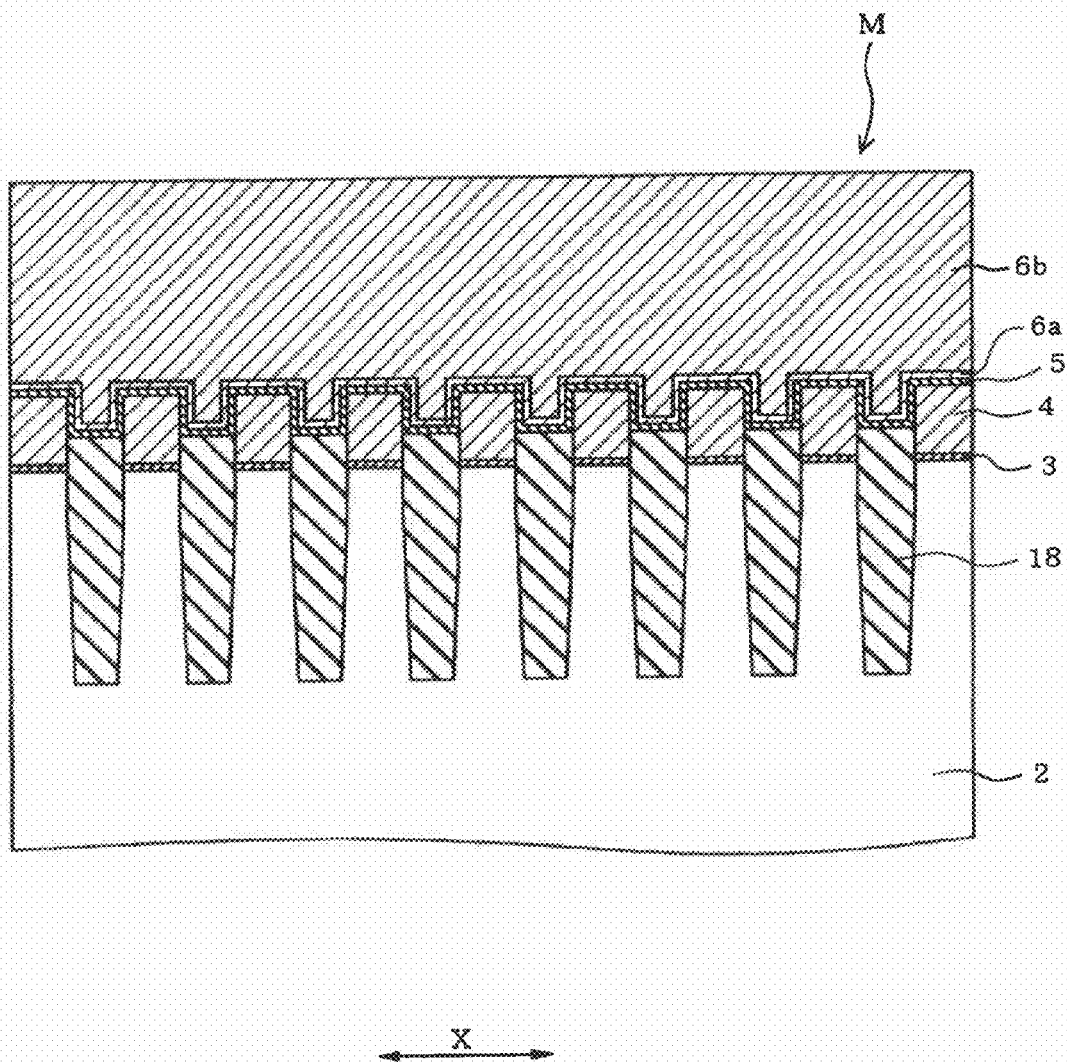

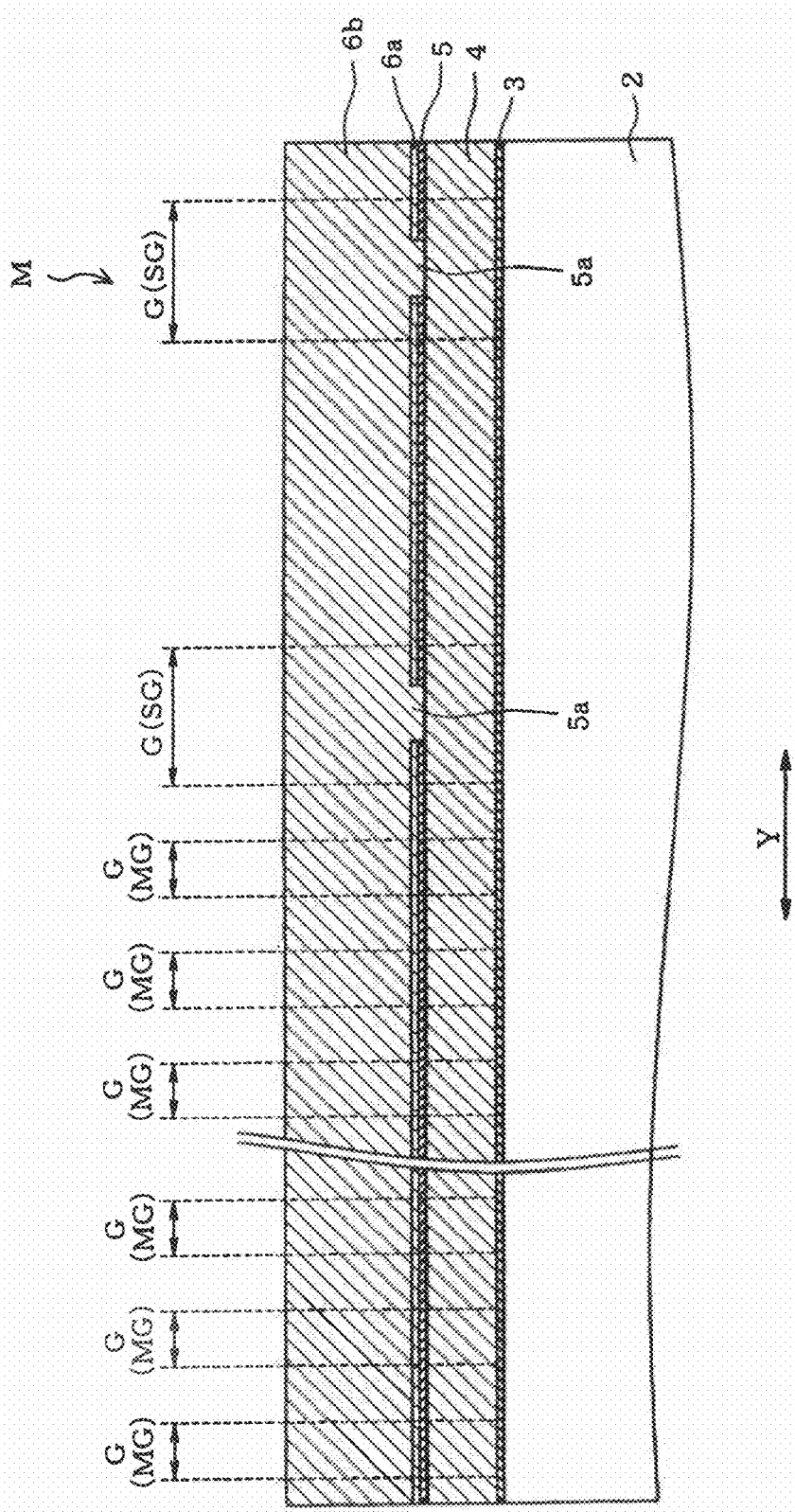

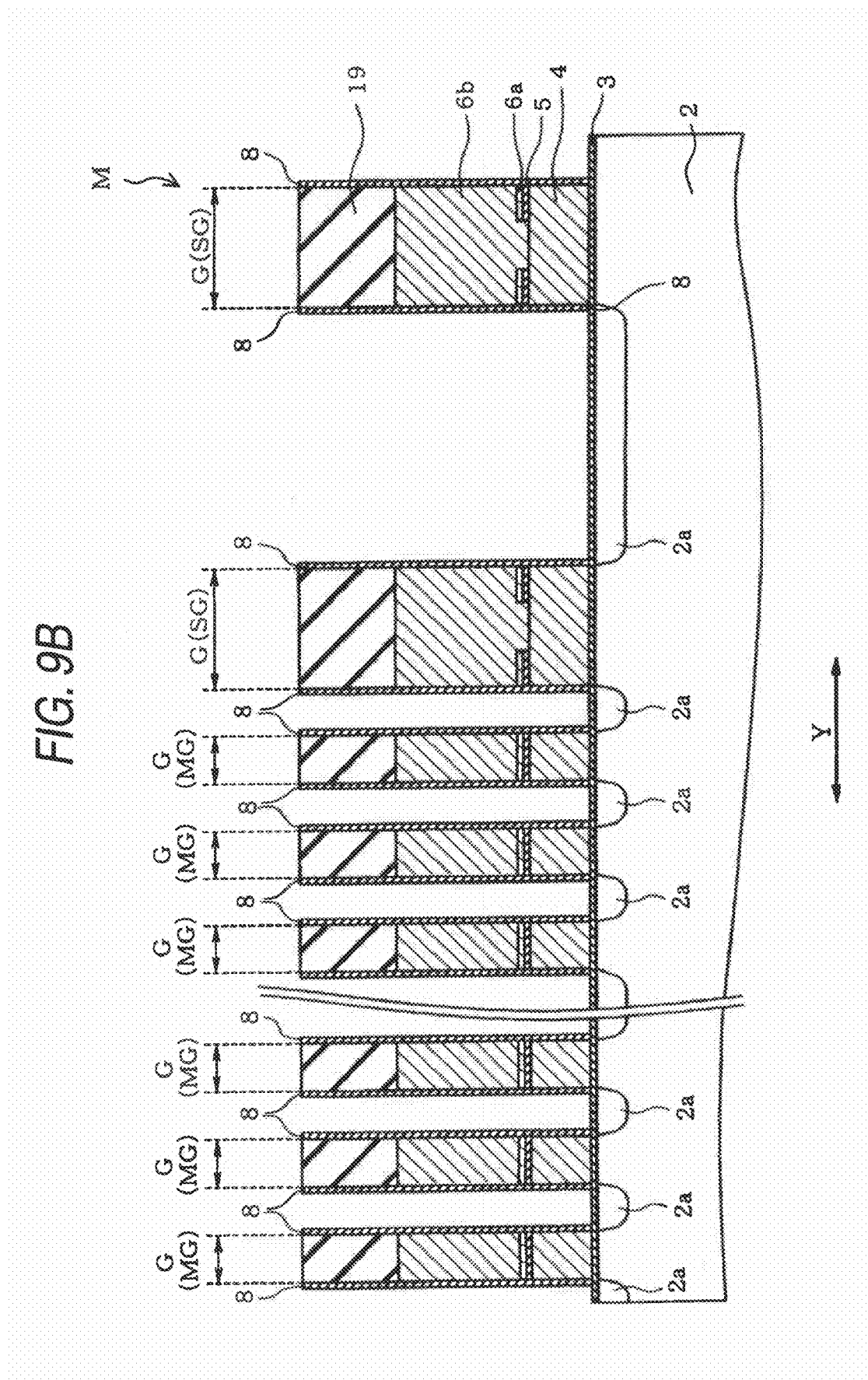

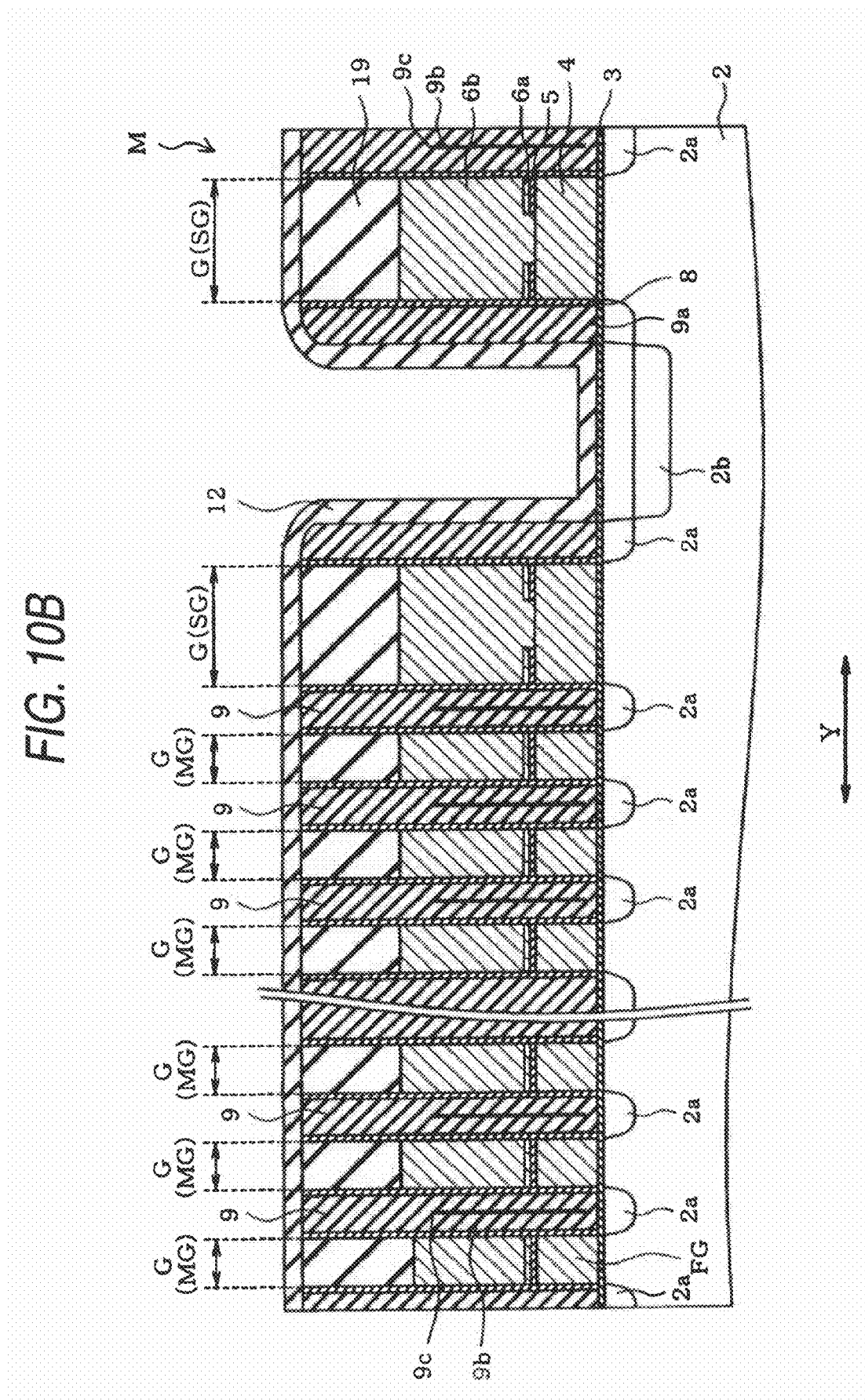

METHOD FOR MANUFACTURING SEMICONDUCTOR DEVICE AND SEMICONDUCTOR DEVICE

CROSS-REFERENCE TO RELATED APPLICATIONS

This application claims priority from Japanese Patent Application No. 2007-185627 filed on Jul. 17, 2007, the entire contents of which are incorporated herein by reference.

BACKGROUND OF THE INVENTION

1. Field of the Invention

An aspect of the present invention relates to a method of manufacturing a semiconductor device provided with a laminated gate electrode and a semiconductor device.

2. Description of the Related Art

In recent years, in the field of semiconductor storage devices, miniaturization of the cell structure is advanced rapidly in association with increase in demand of bulk storage devices such as flash memory devices. On the other hand, the same level or a higher level of the electric property of the device elements or the inter-element wirings as those in the previous generation is required. As a gate electrode of the semiconductor storage element as described above, a structure in which metals are alloyed on the gate electrodes to lower the resistance of the wirings connected to the gate electrodes is generally employed (for example, see JP-2002-231835-A).

A manufacturing method disclosed in JP-2002-231835-A will be described below. An element isolation film is formed on a semiconductor substrate to define linear active areas formed in parallel. A gate insulating film is formed on the active areas of the semiconductor substrate, and a silicon floating gate layer is formed on the gate insulating film. The silicon floating gate layer is patterned to form an intermediate pattern of a floating gate. Then, an isolation insulating film (ONO film) and a doped polysilicon control gate layer are formed. The polysilicon control gate layer, the isolation insulating film, and the intermediate pattern are etched in the direction perpendicular to the direction of formation of the active areas, thereby forming a plurality of gate lines (word lines) perpendicular to the direction of formation of the active areas. Then, a spacer is formed and a source/drain area having a LDD (Lightly Doped Drain) structure is formed to configure the MOS transistor, and then an inter-layer insulating film is formed thereon. Then, part of the inter-layer insulating film is removed to expose the control gate pattern. Then, the metal such as cobalt or titanium is processed on the control gate pattern to form a metal silicide layer.

However, in association with the miniaturization of elements and the tightening of the design rule, the cell wiring pitch is reduced, and hence the width of the gate electrode is also reduced. When the cell wiring pitch is reduced, the width between the gate electrodes, and hence the embedding property of the inter-electrode insulating films embedded therebetween are deteriorated, so that seams are generated in the inter-electrode insulating films. On the other hand, when the width of the gate electrodes is reduced, the resistance of the word lines, which are connected to the gate electrodes, increases. Consequently, the transmission rate of the signals to be transferred in the word lines is lowered. In order to reduce the resistance of the wirings, it is considered to expose the side walls of the control gate by deeply etching back the inter-electrode insulating film, and to alloy metals on the exposed side walls. However, when the etching amount is increased, there arises fear that the seams generated in the inter-electrode insulating films are exposed and expanded.

When the seams in the inter-electrode insulating films are expanded, the metal is apt to enter the seams when the metal is formed on the control gate pattern. Then, even when the etching process is performed in the removing process, the metal entered into the inter-electrode insulating film cannot be removed, so that there arises a fear of short-circuit between the gate electrodes.

SUMMARY OF THE INVENTION

According to an aspect of the present invention, there is provided a method for manufacturing a semiconductor device including: sequentially forming a first gate insulating film, a first gate electrode film, a second gate insulating film, and a second gate electrode film on a semiconductor substrate; forming a groove that separates the second gate electrode film, the second gate insulating film and the first gate electrode film; forming an insulating film inside the groove, the insulating film having an upper surface positioned lower than an upper surface of the second gate electrode film and higher than an upper surface of the second gate insulating film; forming an overhung portion on the second gate electrode film so as to overhang on the upper surface of the insulating film by performing a selective growth process with the second gate electrode film as a seed; and forming a low resistance layer at the overhung portion and the second gate electrode film by performing an alloying process on the overhung portion.

According to another aspect of the present invention, there is provided a semiconductor device including: a semiconductor substrate; a gate insulating film formed on the semiconductor substrate; a plurality of gate electrodes that each includes: a floating gate electrode formed on the gate insulating film; an inter-gate insulating film formed on the floating gate electrode; and a control gate electrode formed on the inter-gate insulating film; and an inter-electrode insulating film formed between the plurality of gate electrodes, wherein each of the control gate electrodes includes an overhung portion that overhangs on an upper surface of the inter-electrode insulating film, respectively.

BRIEF DESCRIPTION OF THE DRAWINGS

Embodiment may be described in detail with reference to the accompanying drawings, in which:

FIG. 3B is a vertical cross-sectional view schematically showing part of the structure of the memory cell area (vertical cross-sectional view taken along the line B-B in FIG. 2);

FIG. 4B is a vertical cross-sectional view schematically showing a manufacturing step (a process explanatory drawing showing an area taken along the line B-B in FIG. 2; No. 1);

FIG. 6B is a vertical cross-sectional view schematically showing a manufacturing step (a process explanatory drawing showing an area taken along the line B-B in FIG. 2; No. 2);

FIG. 7A is a vertical cross-sectional view schematically showing a manufacturing step (a process explanatory drawing showing an area taken along the line A-A in FIG. 2; No. 4);

FIG. 7B is a vertical cross-sectional view schematically showing a manufacturing step (a process explanatory drawing showing an area taken along the line B-B in FIG. 2; No. 3);

FIG. 9B is a vertical cross-sectional view schematically showing a manufacturing step (a process explanatory drawing showing an area taken along the line B-B in FIG. 2; No. 5);

FIG. 10B is a vertical cross-sectional view schematically showing a manufacturing step (a process explanatory drawing showing an area taken along the line B-B in FIG. 2; No. 6);

DETAILED DESCRIPTION OF THE INVENTION

Figure 1:
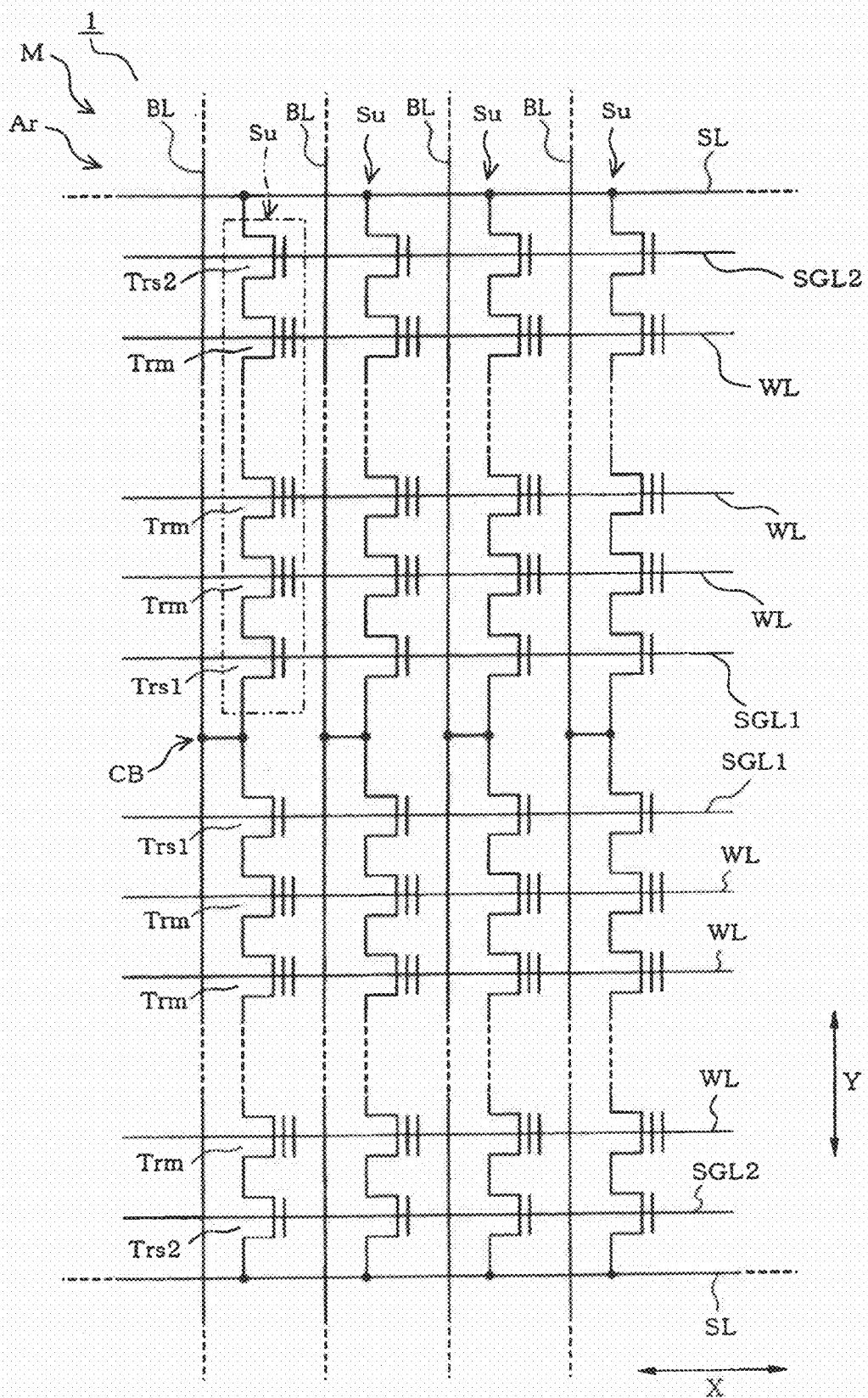
FIG. 1 is a drawing showing part of an electric configuration of a memory cell area in a flash memory device according to a first embodiment of the present invention.

Referring now to the drawings, an embodiment in which a semiconductor device according to the present invention is applied to a NAND type flash memory device will be described. In the description in the drawings to be referred, the same parts or similar parts are designated by the same reference numerals or the similar reference numerals. The drawings are schematic drawings, and the ratio between the thickness and the dimensions in plan view, and the ratio of thickness among the layers are different from the actual product.

Figure 2:
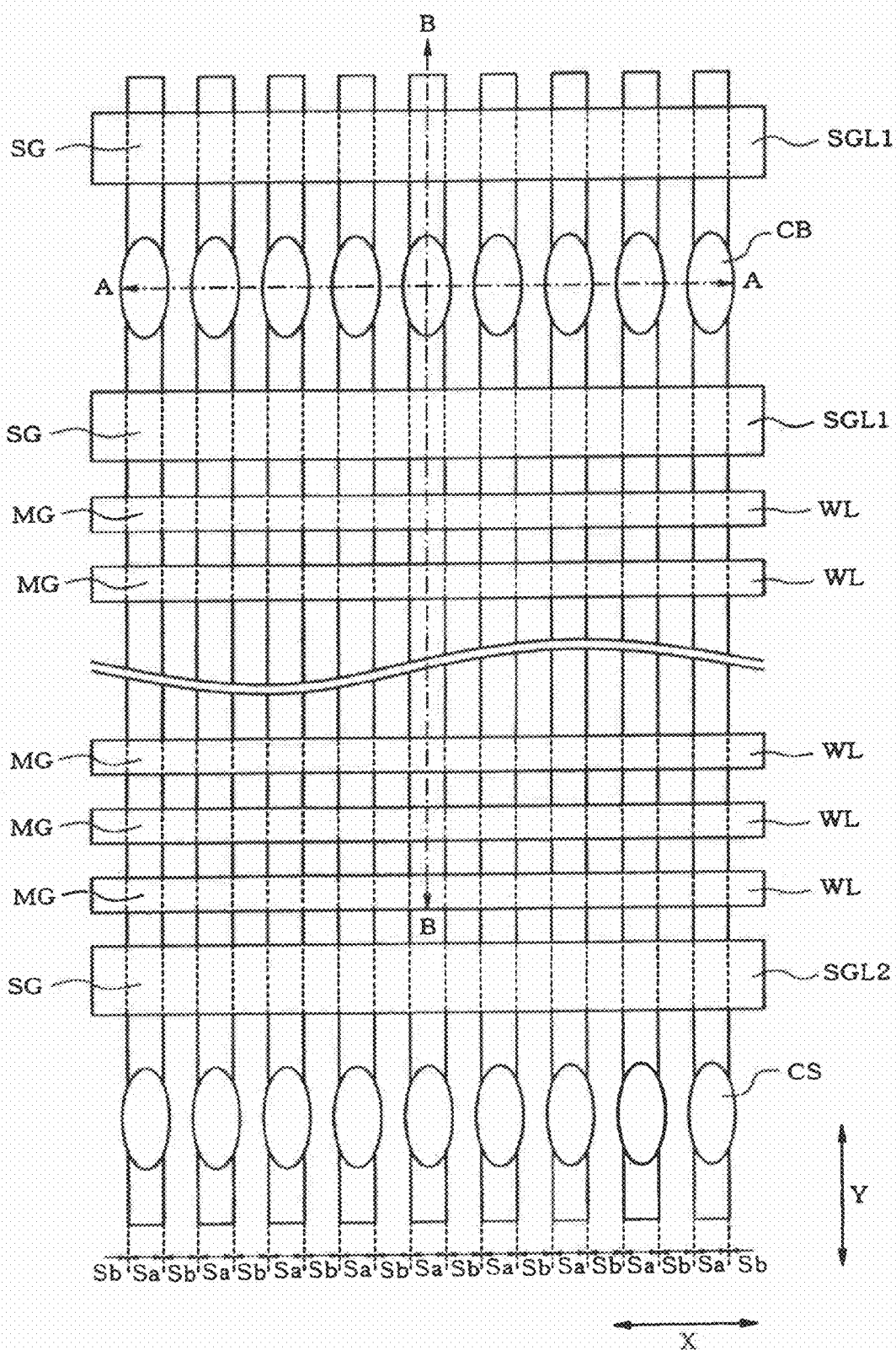
FIG. 2 is a schematic plan view.

FIG. 1 is an equivalent circuit drawing of a portion of a memory cell array of a memory cell area of the NAND type flash memory device, and FIG. 2 is a schematic plan view showing a partial structure of the memory cell area.

A NAND type flash memory device 1 as the semiconductor device is sectionalized into both a memory cell area M and a peripheral circuit area (not shown). As shown in FIG. 1, the memory cell area M includes a memory cell array Ar, and the peripheral circuit area includes a peripheral circuit (not shown) for driving the memory cell array Ar. The peripheral circuit is provided so as to read/write data stored in memory cells in the memory cell array Ar in a non-volatile manner.

The memory cell array Ar of the memory cell area M of the NAND flash memory device 1 includes NAND cell units Su each having two (a plurality of) selection gate transistors Trs1 and Trs2, a plurality of (32 for example, 2 raised to the power of n (n is a positive integer)) memory cell transistors Trm arranged in a matrix pattern. In the NAND cell unit Su, the plurality of memory cell transistors Trm are formed in such a manner that the two adjacent memory cell transistors Trm use a source/drain area (not shown) commonly.

In FIG. 1, the memory cell transistors Trm arranged in an X-direction (the direction of ward line) are commonly connected by word lines (control gate lines) WL. The selection gate transistors Trs1 arranged in the X-direction in FIG. 1 is commonly connected by selection gate lines SGL1. In the same manner, the selection gate transistors Trs2 arranged in the X-direction in FIG. 1 are commonly connected by selection gate lines SGL2.

Bit line contacts CB are connected to the drain areas of the selection gate transistors Trs1. The bit line contacts CB are connected to bit lines BL extending in a Y-direction (which corresponds to the bit line direction) which is orthogonal to the X-direction in FIG. 1. Source lines SL extending in the X-direction in FIG. 1 are connected to the source areas of the selection gate transistors Trs2.

FIG. 2 is a plan view schematically showing a layout pattern of part of the memory cell area.

A silicon substrate 2 as a semiconductor substrate is formed with element isolation areas Sb having a STI (Shallow Trench Isolation) structure in the Y-direction in FIG. 2. The plurality of element isolation areas Sb are formed at given pitches, whereby element areas (active areas) Sa are isolated in the X-direction in FIG. 2.

The plurality of bit line contacts CB are discretely arranged in the X-direction and formed on the plurality of element areas Sa, respectively. Along the X-direction in FIG. 2, in plan view, a pair of the selection gate lines SGL1 are formed across the bit line contacts. In portions where the element areas Sa and the selection gate lines SGL1 intersect, selection gate electrodes SG of the selection gate transistors TRS1 are formed on the element areas Sa, and are connected in the X-direction by the selection gate lines SGL 1.

The word lines WL are formed along the X-direction in FIG. 2. In portions where the word lines WL and the element areas Sa intersect, gate electrodes MG of the memory cell transistors Trm are formed on the element areas Sa. The gate electrodes MG are discretely arranged in the X-direction and in the Y-direction. The world lines WL are formed above the plurality of element areas Sa and the plurality of element isolation areas Sb along the X-direction in FIG. 2, and connect the gate electrodes MG of the respective memory cells (control gate electrodes CG; see FIG. 3B described later) arranged in parallel in the X-direction.

FIG. 3B is a schematic vertical cross-sectional view of a portion taken along the line B-B in FIG. 2, and the cross sections of the selection gate lines SGL1 and the word lines WL are also shown schematically. Although not shown in the drawing, a well is formed on a surface layer of the p-type silicon substrate 2, and the following electric components are formed on the well or in the well.

As shown in FIG. 3B, the memory cell transistors Trm each includes a polycrystalline silicon layer 4, an ONO film 5, a polycrystalline silicon layer 6 (61, 62) doped with impurities such as phosphorous, and a cobalt silicide film 7 in sequence on the silicon substrate 2 as the semiconductor substrate via a silicon oxide film 3, and a source/drain area 2a formed on the surface layer of the silicon substrate 2 on both sides in the Y-direction of the laminated gate electrodes MG.

The silicon oxide film 3 is configured as a gate insulating film or a tunnel insulating film. The polycrystalline silicon layer 4 functions as a floating gate electrode FG. The ONO film 5 is a laminated film including a silicon oxide film-silicon nitride film-silicon oxide film, and is formed so as to cover the polycrystalline silicon layer 4. The ONO film 5 functions as an inter-gate insulating film between the control gate electrode CG and the floating gate electrode FG and as an inter-poly insulating film between the polycrystalline silicon layers 4 and 6.

The gate electrodes SG of the selection gate transistor Trs1 have substantially the same structure as laminated gate electrodes MG of the memory cell transistors Trm. However, the ONO film 5 is formed with a through hole 5a, and the polycrystalline silicon layer (lower electrode) 4 and the polycrystalline silicon layer (upper electrode) 6 are connected via the through hole 5a. The gate electrodes MG, SG are arranged in parallel in the Y-direction.

Between the gate electrodes MG-MG, and between MG-SG, impurity diffused layers 2a, which correspond to the source/drain areas, are formed on the surface layer (surface) of the silicon substrate 2. The impurity diffused layers 2a are also formed on the surface layer (surface) of the silicon substrate 1 immediately beside the gate electrodes SG between the gate electrodes SG-SG. The bit line contact CB is formed at the center between the gate electrodes SG-SG. In an area below the bit line contact CB, high-density impurity diffused layers 2b, which are the same conductive type as the low-density impurity diffused layers 2a, are formed on the surface layer of the silicon substrate 2.

Silicon oxide films 8 for protecting the gate side walls are formed on the side walls of the gate electrodes MG and the side walls of the gate electrodes SG. Between the silicon oxide films 8 formed on the gate electrodes MG and on the gate electrodes SG, and between the silicon oxide films 8 formed on the gate electrodes MG, silicon oxide layers 9 are formed. The silicon oxide films 9 are formed by a LP (Low Pressure)-CVD (Chemical Vapor Deposition) method. Seams 9b are formed at a position near the center of the silicon oxide films 9. The seams 9b are generated when forming the silicon oxide films 9, and upper end portions 9c thereof are closed by the silicon oxide films 9. That is, the upper surface of the silicon oxide films 9 is located in a level higher than the upper end portions 9c of the seam 9b.

The cobalt silicide films 7 are formed on the upper portions of the polycrystalline silicon layers 6. Each cobalt silicide film 7 includes overhung portion CGa overhanging on the adjacent silicon oxide films 9 on both sides in the Y-direction of the control gate electrode CG, respectively. The height of the upper end portion of the cobalt silicide films 7 from the silicon substrate 2 is set to be higher than the height of the upper surfaces of the silicon oxide films 9. With the shape of the cobalt silicide films 7 as described above, the lower resistance is achieved in comparison with the structure in which the side surfaces of the control gate electrodes CG are flush with each other. The height of the overhang portions CGa from the upper surface of the silicon oxide films 9 is set to be larger than lateral dimension of a part overhanging toward the silicon oxide films 9.

The control gate electrodes CG are formed to have substantially the same shape in the depth direction with respect to the paper surface of FIG. 3B. In other words, the word lines WL which connect the control gate electrodes CG in the X-direction have a lower resistance in comparison with the structure in which the side surfaces of the upper portions of the word lines WL have the flush structure (the structure in which the control gate electrodes CG are not overhung on the silicon oxide films 8, 9).

In the upper portions of the gate electrodes SG, the cobalt silicide films 7 having overhung portions SGa are formed, as in the case of the gate electrodes MG.

On the other hand, on the side walls of the silicon oxide films 8 between the opposing pair of the selection gate electrodes SG-SG, spacers 9a which are obtained by machining the silicon oxide films 9 are formed. The silicon oxide films 9 and the spacers 9a are formed on the silicon substrate 2 via the silicon oxide film 3.

The bit line contact CB is positioned substantially at the center between the opposing pair of the selection gate electrodes SG-SG. The bit line contact CB is formed upward from the surface of the silicon substrate 2, so that a bit line BL (not shown in FIG. 3A and FIG. 3B) formed on the upper layer thereof and the impurity diffused layers 2a, 2b on the surface layer of the silicon substrate 2 are electrically connected. The bit line contacts CB each include a barrier metal film 10 and a metal layer 11 formed in the barrier metal film 10.

A barrier film 12 is formed, for example, of a silicon nitride film, and is formed so as to be interposed between the opposing pair of the selection gate electrodes SG and the bit line contact CB. The barrier film 12 is formed along the side wall surfaces of the respective spacers 9a between the opposing pair of the selection gate electrodes SG-SG, and is formed along the upper surface of the silicon substrate 2 via the silicon oxide film 3. An inter-electrode insulating film 13 is formed, for example, of BPSG (Boro Phospho Silicate Glass), and is embedded inside the barrier film 12.

In the memory cell area M, a silicon oxide film 14 is formed so as to cover the upper surface of the gate electrode MG and the upper surface of the silicon oxide films 8, 9 between the gate electrodes MG-MG and MG-SG by using of TEOS gas. Since the silicon oxide film 14 is formed on the upper portion of opposing areas between the respective gate electrodes MG-MG and MG-SG, the coupling capacity between the adjacent gate electrodes MG-MG and SG-MG can be restrained. As viewed from the above, the silicon oxide film 14 is formed along the outer periphery of the bit line contact CB.

A silicon nitride film 15 is formed on the silicon oxide film 14, and a silicon oxide film 16 is formed on the silicon nitride film 15 by plasma CVD method. The films 15, 16 are formed also along the periphery of the bit line contact CB as viewed from the above. The silicon nitride film 15 functions as a barrier film for preventing dispersion of ion or moisture content in the silicon oxide film 16.

Figure 3A:
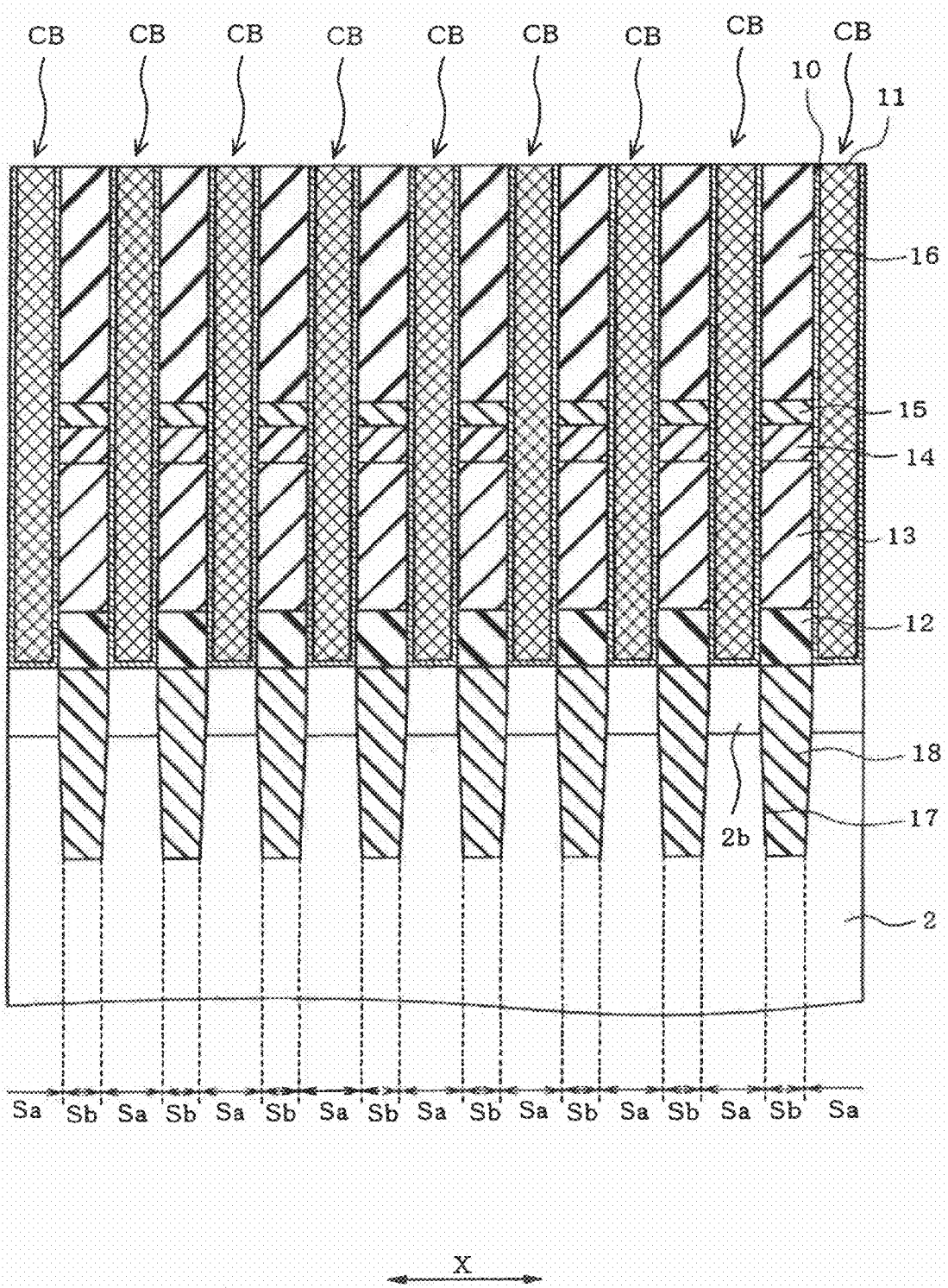
FIG. 3A is a vertical cross-sectional view schematically showing part of the structure of the memory cell area (vertical cross-sectional view taken along the line A-A in FIG. 2)

FIG. 3A is schematic vertical cross-sectional view taken along the line A-A in FIG. 2. As shown in FIG. 3A, the surface layer of the silicon substrate 2 is formed with a plurality of element isolating grooves 17. The element isolating grooves 17 sectionalize and partition the element areas Sa in the X-direction. Element isolation insulating films 18 are embedded in the element isolating grooves 17, thereby forming element isolation areas Sb. The element isolation insulating films 18 are formed, for example, of the silicon oxide film.

On the element areas Sa along the X-direction via the element isolation insulating films 18, the impurity diffused layers 2b are formed as contact areas. On the impurity diffused layers 2b, the bit line contacts CB are formed upward from the upper surface of the silicon substrate 2.

The above-described insulating films 12 to 16 are laminated on the element isolation insulating films 18. The insulating films 12 to 16 are formed between the adjacent bit line contacts CB to maintain the insulating property between the bit line contacts CB.

Referring now to FIG. 4A to FIG. 14, a manufacturing process will be described. The components in the memory cell area M will mainly be described. FIGS. 4A, 5, 6A, 7A, 8A, 9A, 10A and 11A schematically show cross-sectional structures in a manufacturing step taken along the line A-A in FIG. 2, and FIGS. 4B, 6B, 7B, 8B, 9B, 10B, 11B, 12, 13 and 14 schematically show cross-sectional structures in a manufacturing step taken along the line B-B in FIG. 2.

Figure 4A:
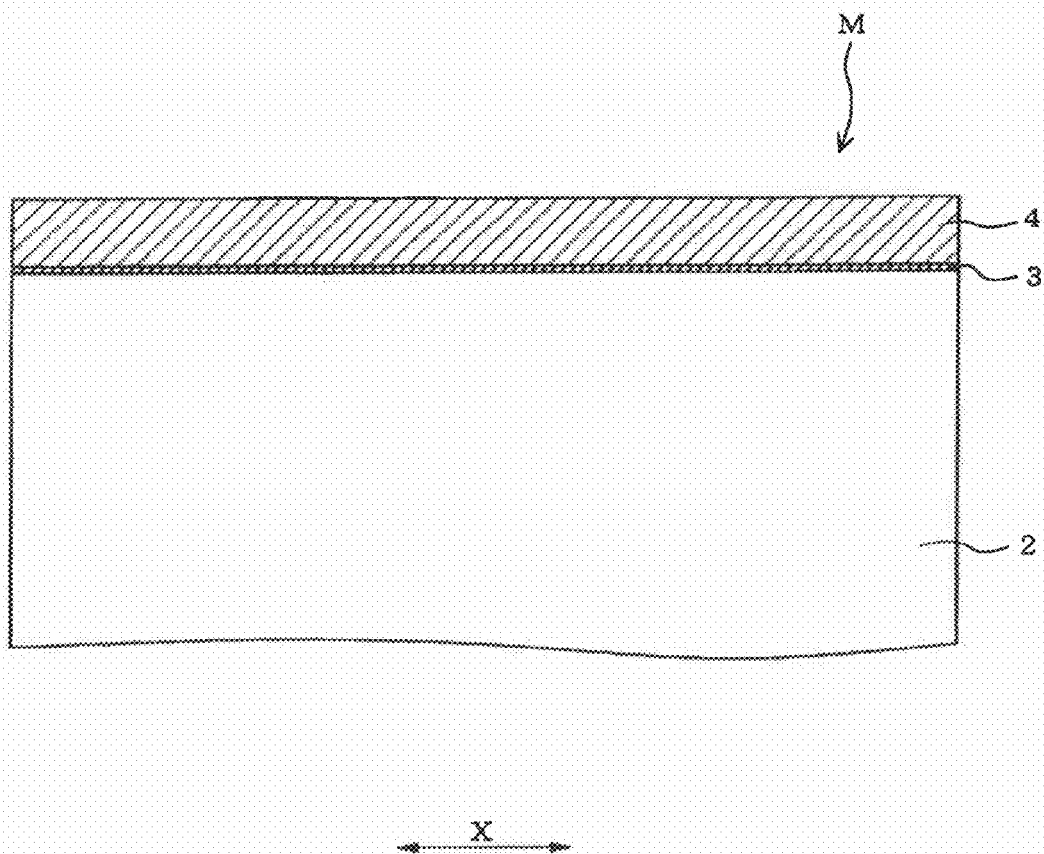
FIG. 4A is a vertical cross-sectional view schematically showing a manufacturing step (a process explanatory drawing showing an area taken along the line A-A in FIG. 2; No. 1)

First of all, ion injection is performed for forming a well area and a channel area (both not shown) in the silicon substrate 2, and a gate insulating film for a high voltage transistor (not shown) of the peripheral circuit area is formed on the silicon substrate 2, and a process of removing selectively a gate insulating film on the memory cell area M and a gate insulating film (not shown) of the low voltage transistor in the peripheral circuit area is performed. Then, the gate insulating film of the low voltage transistor in the peripheral circuit area (not shown) and the silicon oxide film 3 (gate insulating film) on the memory cell area M shown in FIG. 4A and FIG. 4B are formed thinly, so that the film thickness of the gate insulating film on the silicon substrate 2 is adjusted from area to area. Then, the polycrystalline silicon layer 4 is deposited for the floating gate electrode FG by a LP-CVD method.

Figure 5:
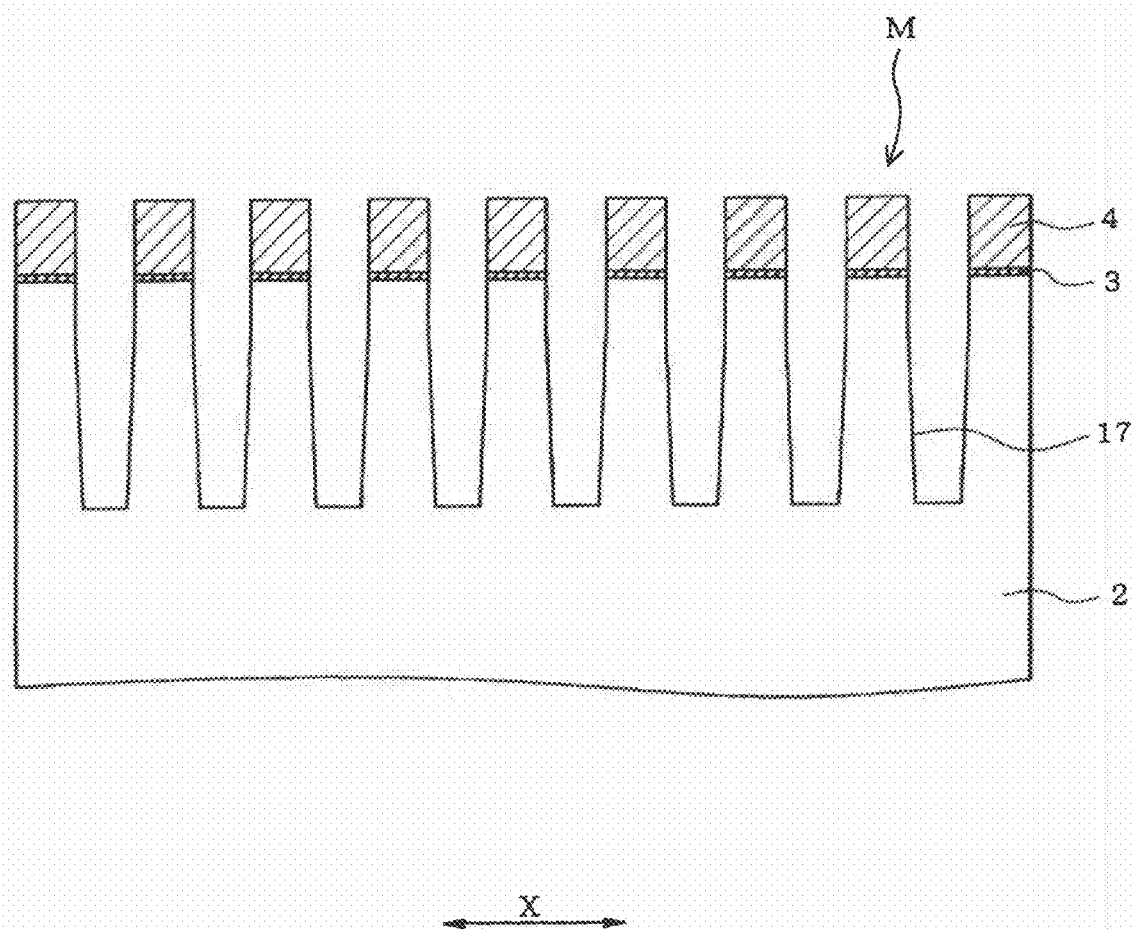
FIG. 5 is a vertical cross-sectional view schematically showing a manufacturing step (a process explanatory drawing showing an area taken along the line A-A in FIG. 2; No. 2)

Subsequently, as shown in FIG. 5, a mask material such as the silicon nitride film or the silicon oxide film (both not shown) is deposited and the element isolating grooves 17 are formed by a lithography method or a RIE (Reactive Ion Etching) method.

Figure 6A:
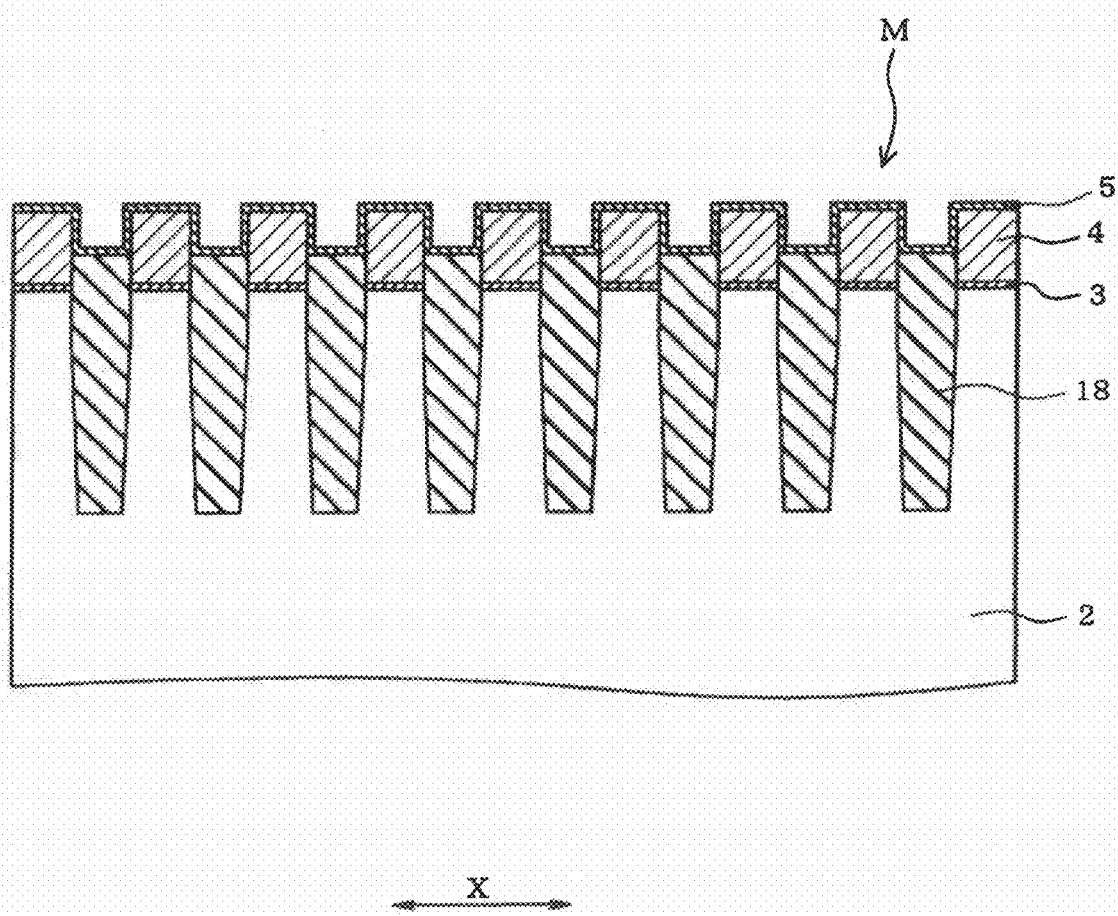
FIG. 6A is a vertical cross-sectional view schematically showing a manufacturing step (a process explanatory drawing showing an area taken along the line A-A in FIG. 2; No. 3)

Subsequently, as shown in FIGS. 6A and 6B, the element isolation insulating films 18 are embedded in the element isolating grooves 17 and a flattening process by the CMP (Chemical Mechanical Polishing) method and a etch back process by the RIE method are performed, so that the height of the upper surface of the element isolation insulating films 18 is adjusted to be lower than the upper surface of the polycrystalline silicon layer 4 and to be higher than the upper surface of the silicon oxide film 3. This process is performed to obtain a high coupling ratio by increasing the opposed areas between the floating gate electrode FG and the control gate electrode CG. Subsequently, the mask material is removed, and then the ONO film 5 is formed along the exposed surfaces of the polycrystalline silicon layers 4 and the element isolation insulating films 18 by the LP-CVD method.

Subsequently, as shown in FIG. 7A and FIG. 7B, a polycrystalline silicon layer 6a and a polycrystalline silicon layer 6b are deposited in sequence. At this time, as shown in FIG. 7B, in gate electrode forming areas G of the selection gate electrode SG, after having deposited the polycrystalline silicon layer 6a, etching process is performed to form holes in the polycrystalline silicon layer 6a and to form the through holes 5a in the ONO film 5 below the holes, and then the polycrystalline silicon layer 6b is deposited, so that the polycrystalline silicon layer 4 and the polycrystalline silicon layer 6b are brought into contact with each other for electrical conduction.

Figure 8A:
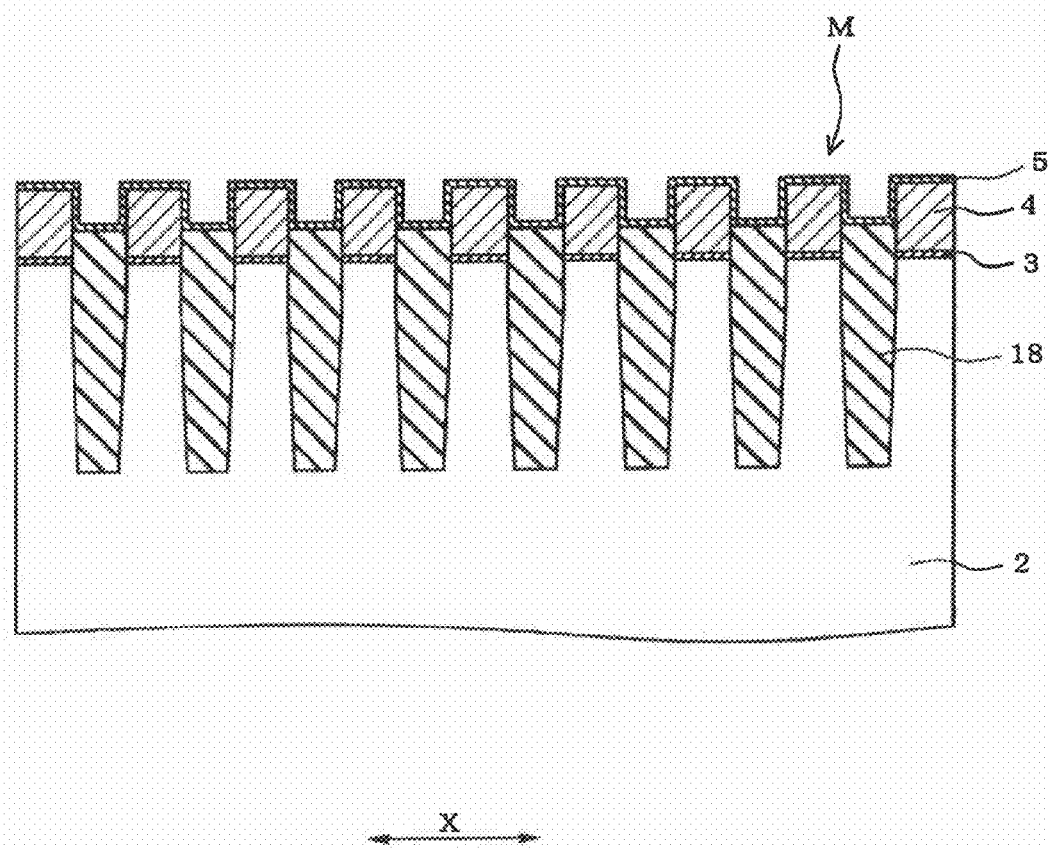
FIG. 8A is a vertical cross-sectional view schematically showing a manufacturing step (a process explanatory drawing showing an area taken along the line A-A in FIG. 2; No. 5)
Figure 8B:
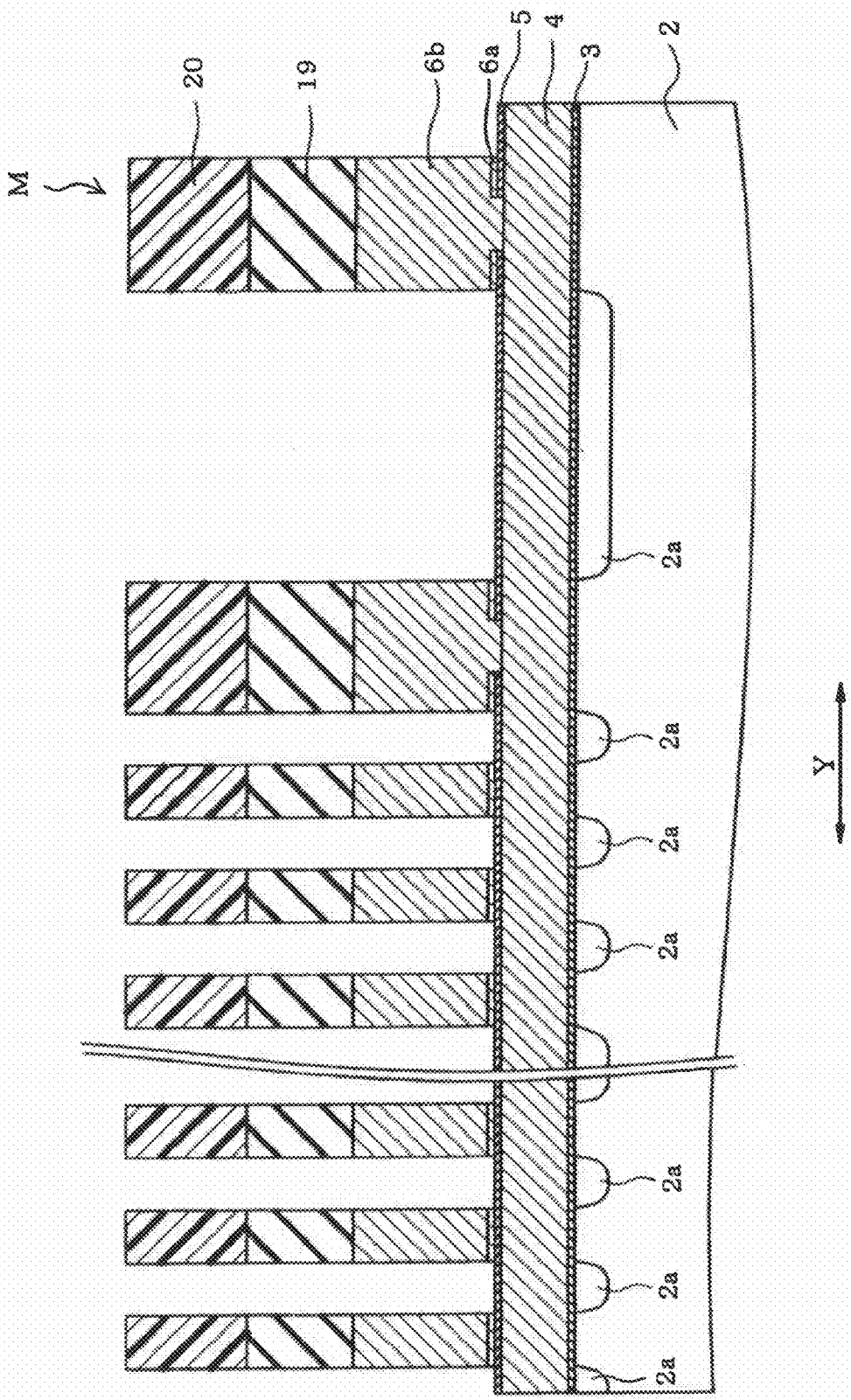
FIG. 8B is a vertical cross-sectional view schematically showing a manufacturing step (a process explanatory drawing showing an area taken along the line B-B in FIG. 2; No. 4)

Subsequently, as shown in FIG. 8A and FIG. 8B, a silicon nitride film 19 is deposited as a hard mask (mask pattern) and a resist 20 is applied thereon. The resist 20 is patterned by the lithography technology, and then the silicon nitride film 19 is etched by the RIE method. Subsequently, the resist 20 is peeled off by ashing and the polycrystalline silicon layers 6 (6a, 6b) are etched by RIE method.

Figure 9A:
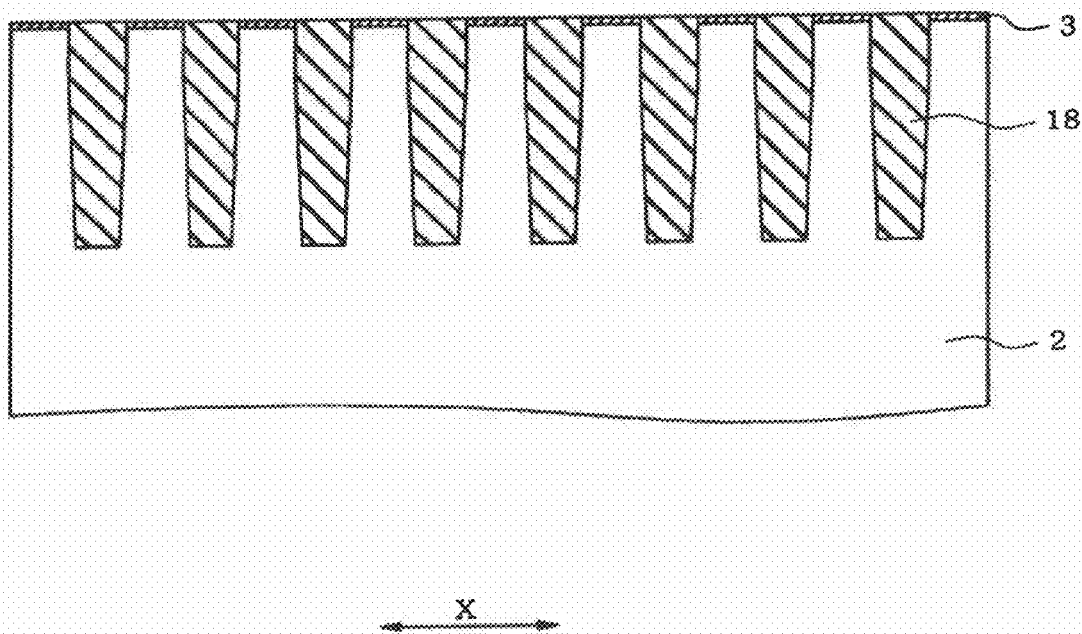
FIG. 9A is a vertical cross-sectional view schematically showing a manufacturing step (a process explanatory drawing showing an area taken along the line A-A in FIG. 2; No. 6)

Subsequently, as shown in FIG. 9A and FIG. 9B, the ONO film 5 is etched by the RIE method, and the polycrystalline silicon layer 4 is etched and removed. The ONO film 5 is over-etched, so that the ONO film 5 formed on the upper side surfaces of the polycrystalline silicon layer 4 sections (see FIG. 8A) is removed and, simultaneously, the level of the upper portion of the element isolation insulating films 18 is lowered to a level aside the silicon oxide film 3. The etching of the polycrystalline silicon layer 4 is performed under the condition of having high selectivity for the silicon oxide film 3. The peeling of the resist 20 may be performed after having performed the polycrystalline silicon layer 4 removing process or before the processing of the layers 4 to 6. Although the silicon oxide film 3 is remained in the embodiment, the silicon oxide film 3 may be removed.

Subsequently, although it is not shown in the drawing, a thick gate insulating film (not shown) formed on the silicon substrate 2 (source/drain area) of the high voltage transistor (not shown) for the peripheral circuit is etched and removed.

Figure 10A:
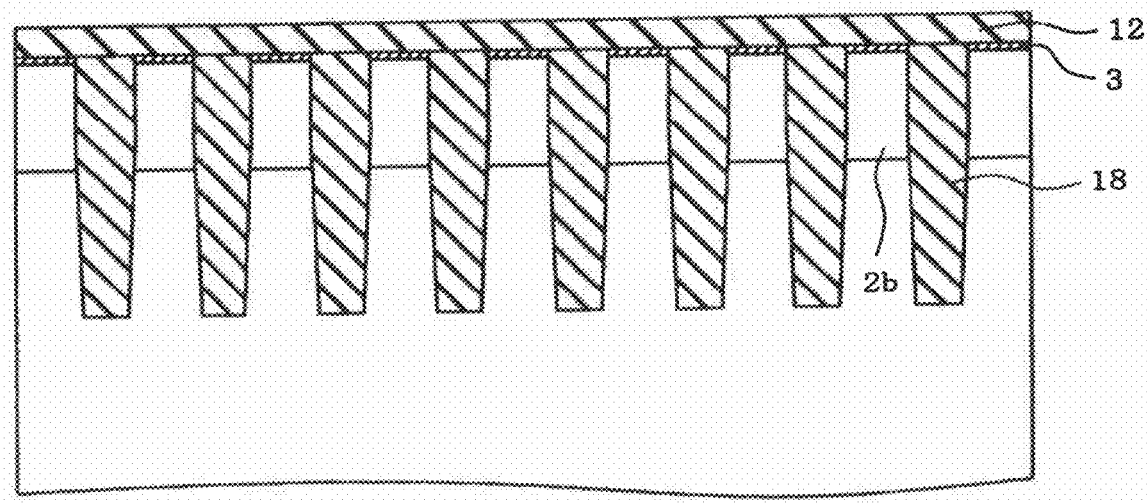
FIG. 10A is a vertical cross-sectional view schematically showing a manufacturing step (a process explanatory drawing showing an area taken along the line A-A in FIG. 2; No. 7)

Subsequently, as shown in FIG. 9A and FIG. 9B, the silicon oxide films 8 is formed along the side wall surfaces of the respective laminated films 4 to 6 and 19, and ion injection for forming a diffused layer 2a is performed. Subsequently, as shown in FIGS. 10A and 10B, the silicon oxide films 9 are deposited between the plurality of laminated films 4 to 6 and 19 sections, and the upper surface of the silicon oxide films 9 is etched back so as to be substantially flush with the upper surface of the silicon nitride film 19 by RIE method. In this case, since the spaces between the gate electrode forming areas G-G of the gate electrodes MG-SG and the gate electrodes MG-MG are narrow, the seams 9b in the vertical direction are generated in the silicon oxide films 9.

The area between the gate electrode forming areas G-G of the gate electrodes SG-SG is wider than the area between the gate electrode forming areas G-G of the gate electrodes MG-MG. Therefore, in the gate electrode forming areas G-G of the gate electrodes SG-SG, the silicon oxide films 9 are formed along the side wall surfaces of the laminated film 4 to 6 and 19 sections. After the etching back performed thereafter, the upper end surfaces of the silicon oxide films 9a in this area are curved in the direction to widen the opening between the gate electrode forming areas G-G of the gate electrodes SG-SG. Although not shown in the drawings, the silicon oxide films 9a after having processed are also formed on the side walls of the gate electrodes of the high voltage MOS transistor and the low voltage MOS transistor formed in the area of the peripheral circuit and are sued as spacers for forming a LDD (Lightly Doped Drain) structure. Subsequently, a silicon nitride film 12 is formed thinly so as to cover the silicon oxide films 8, 9 and 9a, and the respective gate electrode forming areas G of the gate electrodes MG and SG, the element isolation insulating films 18 and the silicon oxide film 3.

Figure 11A:
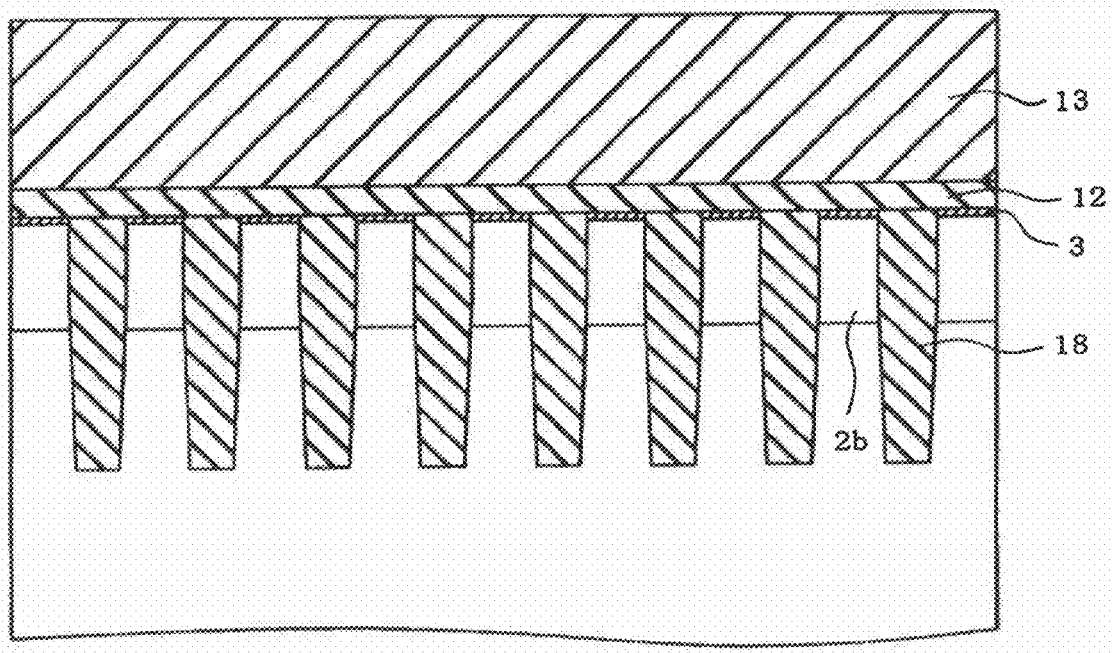
FIG. 11A is a vertical cross-sectional view schematically showing a manufacturing step (a process explanatory drawing showing an area taken along the line A-A in FIG. 2; No. 8)
Figure 11B:
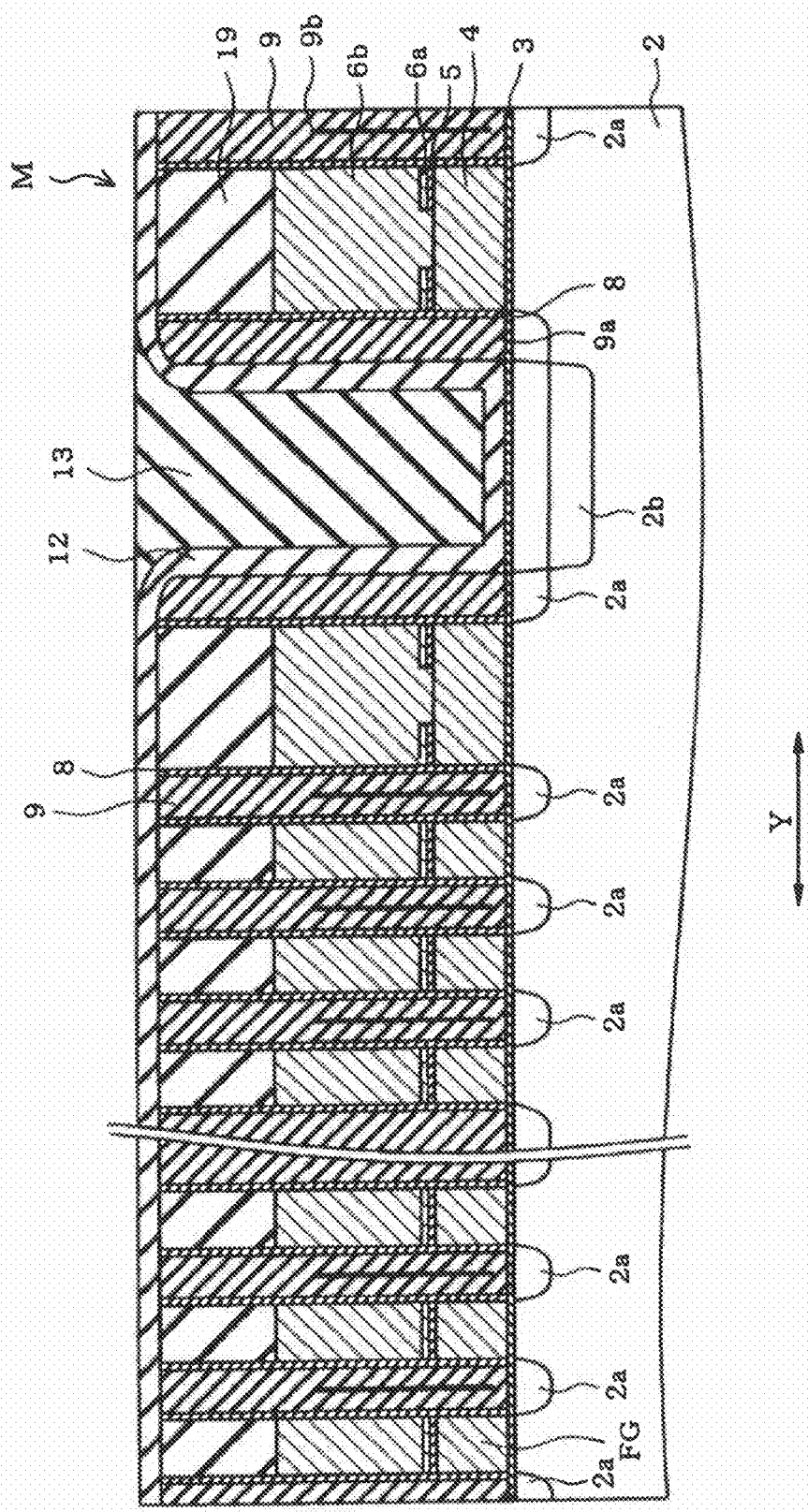
FIG. 11B is a vertical cross-sectional view schematically showing a manufacturing step (a process explanatory drawing showing an area taken along the line B-B in FIG. 2; No. 7)

Subsequently, as shown in FIG. 11A and FIG. 11B, the inter-electrode insulating film 13 formed of BPSG (Boron Phosphorous Silicon Glass) is embedded, and the silicon nitride film 12 is flattened by the CMP method as a stopper. The silicon nitride film 12 is provided to prevent impurities from the inter-electrode insulating film 13 from being diffused. The silicon nitride film 12 is formed also to prevent oxidizing agent from being dispersed.

Figure 12:
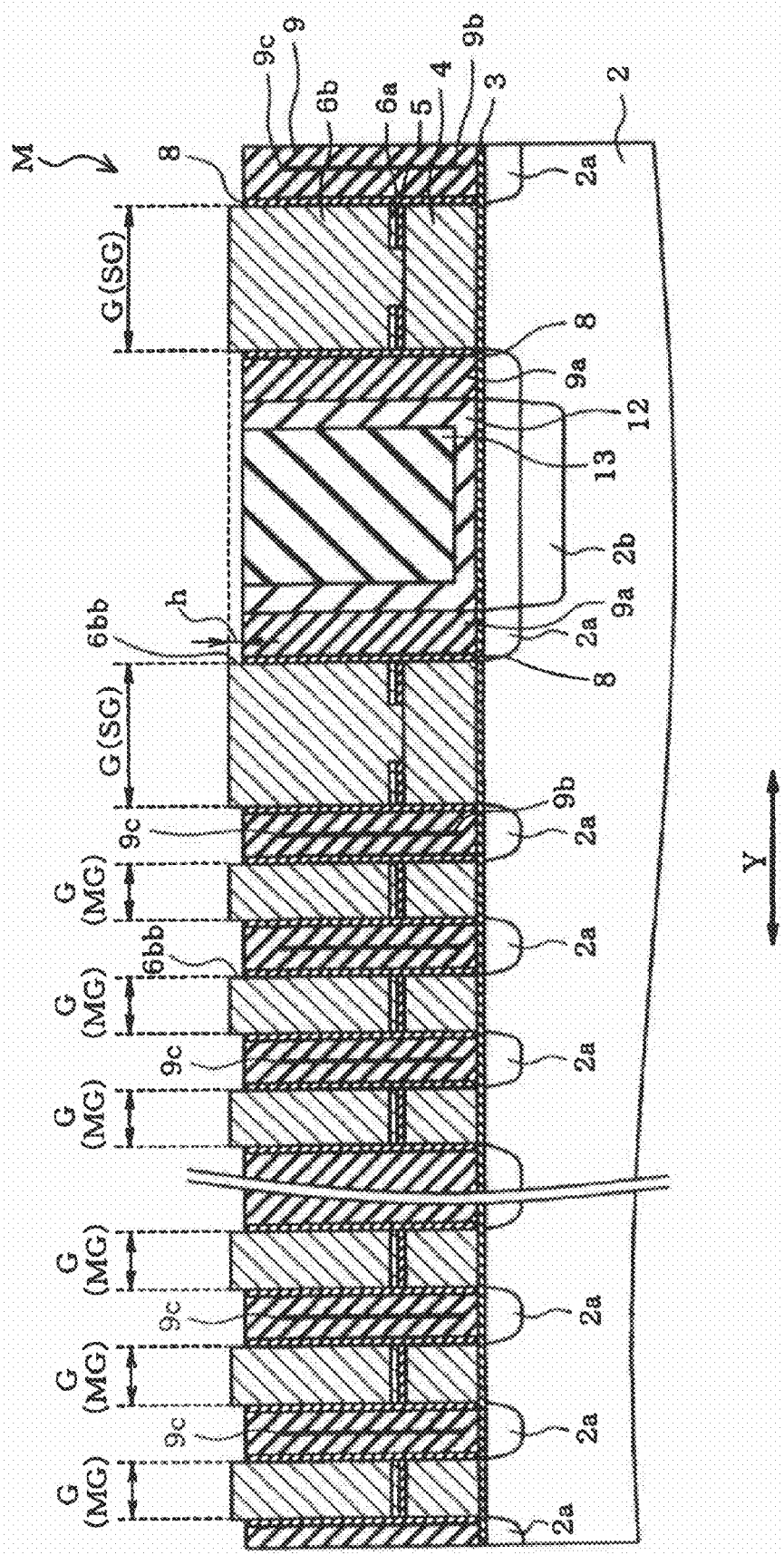
FIG. 12 is a vertical cross-sectional view schematically showing a manufacturing step (a process explanatory drawing showing an area taken along the line B-B in FIG. 2; No. 8)

Subsequently, as shown in FIG. 12, the silicon nitride films 12, 19 are etched back by the RIE method, then, the silicone oxide films 8, 9 are etched by the RIE method under the condition of having high selectivity for the polycrystalline silicon.

At this time, when a height of depression h of the silicon oxide films 8 and 9 is large, the exposed surface area on upper side surfaces 6bb of the polycrystalline silicon layer 6b is increased. Therefore, the resistance of the control gate electrodes CG (word lines WL) can be lowered by forming a silicide layer on the polycrystalline silicon layer 6b later by causing resistance lowering metal to react. However, when the height of depression h is increased and hence the exposed surface area of the upper side surfaces 6bb of the polycrystalline silicon layer 6b is increased too much, the upper end portions 9c of the seams 9b generated in the silicon oxide films 9 may be exposed.

When the height of depression h of the silicon oxide films 8 and 9 is too small, the upper end portions 9c of the seams 9b are not exposed. However, the resistant of the control gate electrodes CG (word lines WL) cannot be lowered. Therefore, when etching back the silicon oxide films 8, 9, the height of depression h is adjusted by adjusting the process time and, as shown in FIG. 12, so that the upper end portions 9c of the seams 9b are not be exposed while exposing the upper side surfaces 6bb of the polycrystalline silicon layer 6b.

Figure 13:
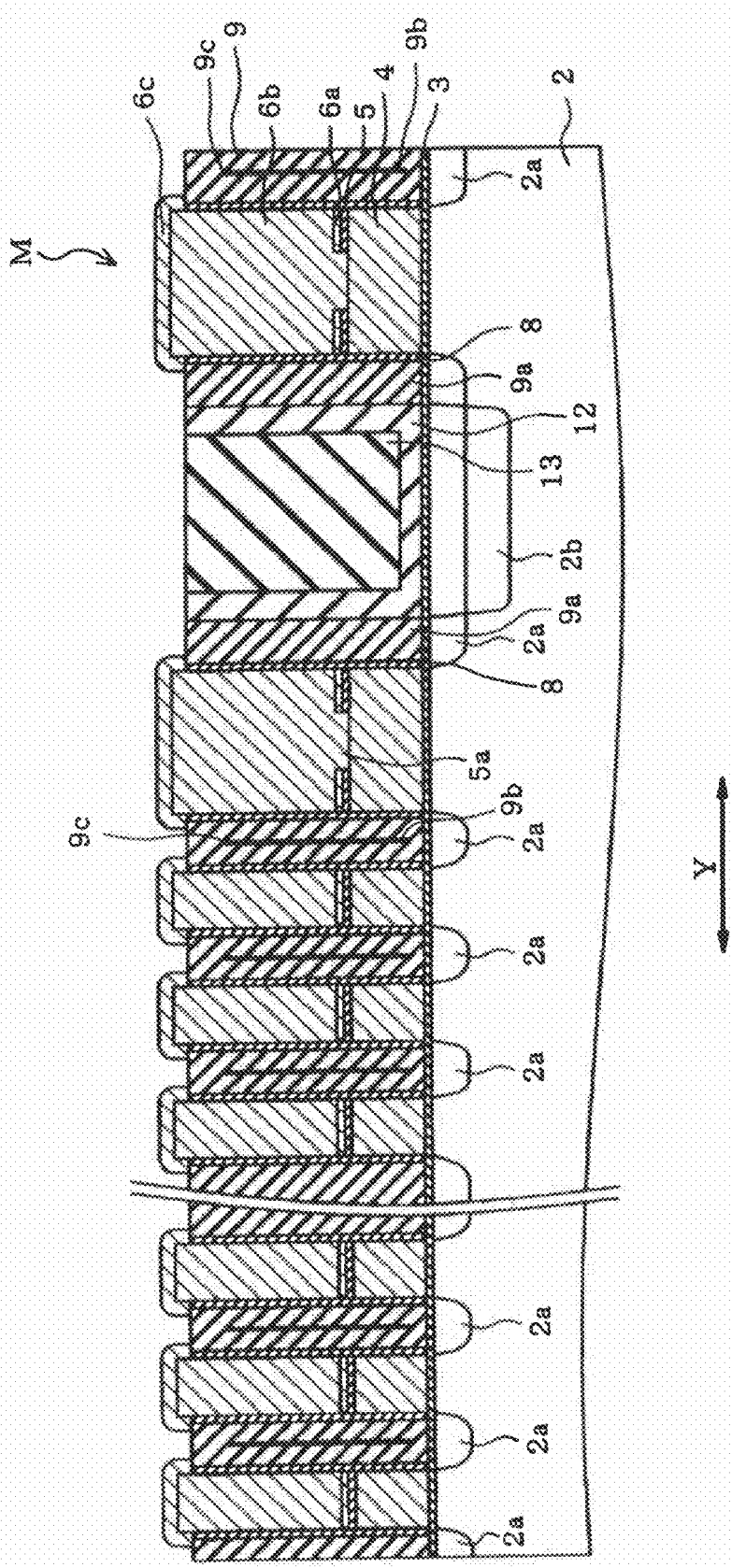
FIG. 13 is a vertical cross-sectional view schematically showing a manufacturing step (a process explanatory drawing showing an area taken along the line B-B in FIG. 2; No. 9)

Subsequently, as shown in FIG. 13, selective growth process of silicon is performed with the polycrystalline silicon layer 6b as a seed. In this case, the upper portion of the polycrystalline silicon layer 6b grows further upward and, simultaneously, overhangs above the silicon oxidizing films 8, 9 and glows as a selectively grown portion 6c.

Figure 14:
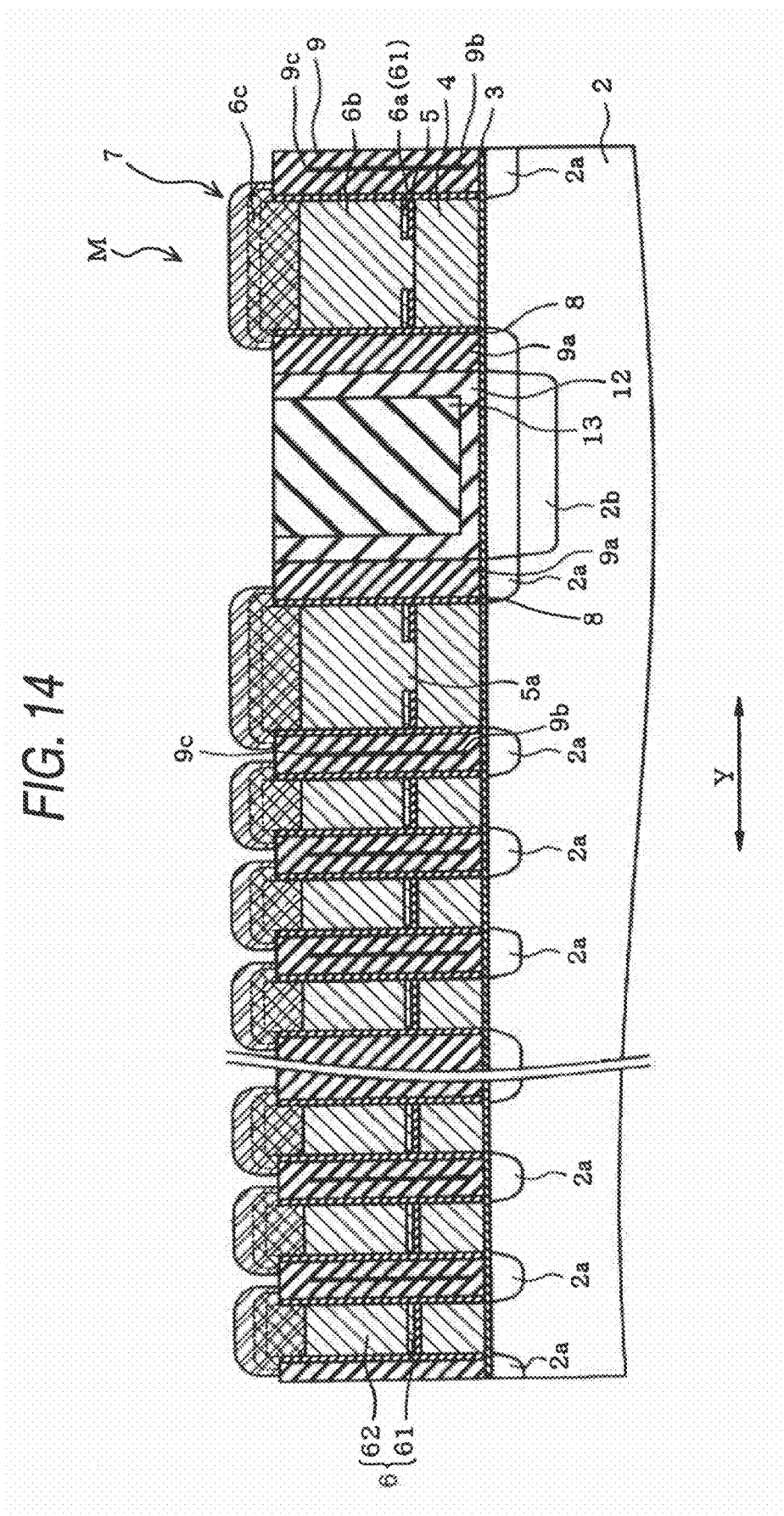
FIG. 14 is a vertical cross-sectional view schematically showing a manufacturing step (a process explanatory drawing showing an area taken along the line B-B in FIG. 2; No. 10).

Subsequently, as shown in FIG. 14, a film of cobalt/titanium is formed on the selectively grown portion 6c by a continuous spattering process and repeating annealing process (for example, lamp annealing process) and metal peeling process by wet etching process, so that the cobalt silicide (CoSi$_2$) film 7 is formed. Since the selectively grown portion 6c is formed upward on the silicon oxide films 8, 9, and overhangs on the adjacent silicon oxide films 8, 9, the metal-to-silicide reaction area is larger than in the related art, so that the resistance of the control gate electrode CG can be lowered. In particular, since the selectively grown portion 6c is formed to be higher in the upward direction in comparison with the width of the overhanging portion thereof above the silicon oxide films 8, 9, the metal-to-silicide reaction area can be increased in comparison with the related art, and the resistance of the control gate electrodes CG can be lowered. The cobalt silicide films 7 are formed over the entirely selectively grown portion 6c and over the upper portion of the polycrystalline silicon layer 6b. After having ended this step, the interface between the cobalt silicide films 7 and the polycrystalline silicon layer is formed at a level lower than the upper surface of the silicon oxide films 8, 9. As described above, the control gate electrodes CG having the polycrystalline silicon layer 6 formed of the polycrystalline silicon layer 6a (61) and the lower portion (62) thereof and the cobalt silicide films 7 is formed.

When the height of depression h of the silicon oxide films 9 is large, the upper end portions 9c of the seams 9b in the silicon oxide films 9 is be exposed. Further, by the wet etching process or chemical dry etching process performed before forming the cobalt silicide films 7, the area of the seam 9b is increased. Therefore, metal such as cobalt/titanium easily enter the seams 9b. Then, the entered metal cannot be removed by, for example, the wet etching process, and the short circuit occurs between the respective gate electrodes MG-MG. Accordingly, in this embodiment, the etching back process time is adjusted so as not allow the upper end portions 9c of the seams 9b to be exposed, and applies the selective growth thereto with the polycrystalline silicon layer 6b as a seed, whereby the upper portion of the polycrystalline silicon layer 6b is formed to overhang on the adjacent silicon oxide films 8, 9 as the selectively grown portion 6c, thereby increasing the metal reaction area.

Therefore, by alloying the metal such as cobalt, the resistance of the control gate electrodes CG can be lowered. In other words, the wiring resistance of the control gate electrodes CG (word lines WL) is lowered by the volume expansion of the gate electrodes MG, while reducing the height of depression h.

Subsequently, as shown in FIG. 3A and FIG. 3B, the silicon oxide film 14 formed by using TEOS gas is deposited by the plasma CVD method, then the silicon nitride film 15 is formed as a barrier film, and then the silicon oxide film 16 is formed by using the TEOS gas by the high-density plasma CVD method in sequence. Subsequently, contact holes (no reference numeral is designated) penetrating toward the silicon substrate 2 are formed in the bit line contacts CB formed areas at the substantially center between the selection gate electrode SG-SG, the barrier metal films 10 using Ti/TiN are formed by the spattering process along the inner surfaces of the contact holes, the metal layers 11 are embedded inside the barrier metal films 10 and flattened, so that the bit line contacts CB are formed. Description of the back end process to be performed thereafter is omitted because it does not relate to the characteristics of this embodiment.

According to this embodiment, since the selectively grown portion 6c generated by selective growth with the polycrystalline silicon layer 6b as a seed are formed so as to overhang on the adjacent silicon oxide films 8, 9, the metal reaction area can be enlarged, so that the resistance of the control gate electrodes CG (word lines WL) is lowered. Since the cobalt silicide films 7 is formed so as to overhang on the adjacent silicon oxide films 8, 9, the control gate electrodes CG have the overhung portions CGa swelling in the Y-direction, thereby reducing the resistance of the control gate electrodes CG (word liens WL). Since the height of the overhung portions CGa are larger than the width of portions overhanging on the adjacent silicon oxide films 8, 9, the resistance of the control gate electrodes CG is further lowered.

Since the selection gate electrodes SG are formed with overhanging portions SGa over the adjacent silicon oxide films 8, 9 in the same manner as the gate electrode MG, the resistance of the selection gate electrodes CG can be lowered.

When forming the silicon oxide films 8, 9 between the respective laminated films 4 to 6 and 19, the height of depression h (etch back amount) is reduced in comparison with that in the related art to prevent the upper end portions 9c of the seams 9b from being exposed. Therefore, even when the film of metal such as of cobalt or titanium is formed later on, the metal is surely prevented from entering the seams 9b, and the short circuit between the control gate electrodes CG-CG (word lines WL-WL) can be prevented.

OTHER EMBODIMENT

The present invention is not limited to the above-described embodiment, and it is possible to modify or expand as shown below is possible.

Although the silicon substrate 2 is applied as the semiconductor substrate, various types of semiconductor substrate may be applied. Although the invention is applied to the NAND type flash memory device 1, the invention may also be applied to the NOR type flash memory device or other semiconductor device.

The present invention may also be applied to a gate electrode having a MONOS structure in which the silicon nitride layer is applied as the floating gate electrode FG.

The ONO film 5 is applied as the inter-gate insulating film, the present invention may also be applied to the inter-gate insulating film structure including a high insulating film such as alumina. It is also possible to perform a SPA nitriding process before and after forming the ONO film 5 to form silicon nitride film layers on both surfaces of the ONO film 5, and the high insulating film such as, so called NONON (silicon nitride film-silicon oxide film-silicon nitride film-silicon oxide film-silicon nitride film) film or the like may also be applied.

A MOS transistor of a DDD (Double Doped Drain) structure may be used as the peripheral circuit instead of the MOS transistor of the LDD structure.

Although cobalt/titanium is applied as metals for alloying for lowering the resistance, other metals may also be applied.

The above-described embodiments are illustrative only for showing examples of a device or a method for embodying the technical idea in the invention, and the technical idea of the present invention does not intend to limit the material, shape, structure, arrangement and so on of the components to the above-described embodiment. The technical idea of the present invention may be modified in various manners within the range of the appended claims.

According to an aspect of the present invention, exposure of embedding defects, such as seams, generated in inter-electrode insulating film can be restrained, and short circuit between the gate electrodes can be prevented.

What is claimed is:

1. A semiconductor device comprising:
   a semiconductor substrate including a first upper surface;
   a gate insulating film formed on the first upper surface of the semiconductor substrate;
   a plurality of gate electrodes that each includes:
   a floating gate electrode formed on the gate insulating film;
   an inter-gate insulating film formed on the floating gate electrode; and
   a control gate electrode formed on the inter-gate insulating film, the control gate electrode including a polycrystal silicon layer located on the inter-gate insulating film and a metal silicide layer formed on the polycrystal silicon layer; and an inter-electrode insulating film formed between the plurality of gate electrodes, wherein each of the control gate electrodes includes an overhung portion that overhangs on a second upper surface of the inter-electrode insulating film, respectively, and
   wherein an interface between the polycrystal silicon layer and the metal silicide layer is positioned lower than the second upper surface of the inter-electrode insulating film and higher than an interface between the polycrystal silicon layer and the inter-gate insulating film, respectively.

2. The semiconductor device according to claim 1,
   wherein a projecting amount of the control gate electrode from the second upper surface of the inter-electrode insulating film in a vertical direction is larger than an overhanging amount of the overhung portion from a side surface of the inter-electrode insulating film in a horizontal direction.

3. The semiconductor device according to claim 1,
   wherein the floating gate electrode includes a polycrystal silicon layer.

4. The semiconductor device according to claim 1,
   wherein the inter-gate insulating film includes a pair of silicon oxide films and a silicon nitride film located between the silicon oxide films.

5. The semiconductor device according to claim 1,
   wherein the metal silicide layer includes a cobalt silicide.

6. The semiconductor device according to claim 1, further comprising:
   an interlayer insulating film formed on the control gate electrode and the second upper surface of the inter-electrode insulating film and a silicon nitride layer formed on the interlayer insulating film.

* * * * *